(12) United States Patent
Ukumori

(10) Patent No.: US 11,619,674 B2
(45) Date of Patent: Apr. 4, 2023

(54) STATE ESTIMATION METHOD AND STATE ESTIMATION APPARATUS

(71) Applicant: GS Yuasa International Ltd., Kyoto (JP)

(72) Inventor: Nan Ukumori, Kyoto (JP)

(73) Assignee: GS YUASA INTERNATIONAL LTD., Kyoto (JP)

( * ) Notice: Subject to any disclaimer, the term of this patent is extended or adjusted under 35 U.S.C. 154(b) by 0 days.

(21) Appl. No.: 17/254,767

(22) PCT Filed: Jun. 19, 2019

(86) PCT No.: PCT/JP2019/024224
§ 371 (c)(1),
(2) Date: Dec. 21, 2020

(87) PCT Pub. No.: WO2020/004163
PCT Pub. Date: Jan. 2, 2020

(65) Prior Publication Data
US 2021/0270904 A1   Sep. 2, 2021

(30) Foreign Application Priority Data
Jun. 25, 2018   (JP) .............................. JP2018-120126

(51) Int. Cl.
*G01R 31/385* (2019.01)
*G06N 7/00* (2006.01)
(Continued)

(52) U.S. Cl.
CPC ....... *G01R 31/385* (2019.01); *G01R 31/3646* (2019.01); *G01R 31/392* (2019.01); *G06N 7/005* (2013.01); *H01M 10/48* (2013.01)

(58) Field of Classification Search
CPC .................. G01R 31/385; G01R 31/392; G01R 31/3646; H01M 10/48; G06N 7/005
(Continued)

(56) References Cited

U.S. PATENT DOCUMENTS

2006/0181245 A1    8/2006  Mizuno et al.
2007/0245163 A1*  10/2007  Lu ........................ G06F 1/3203
                                                                   713/300
2015/0260800 A1*   9/2015  Baba .................... G01R 31/382
                                                                   702/63

FOREIGN PATENT DOCUMENTS

CN           107895175 A       4/2018
CN           105137358 B       6/2018
(Continued)

OTHER PUBLICATIONS

International Searching Authority, International Search Report and Written Opinion for International Application No. PCT/JP2019/024224, dated Sep. 3, 2019, (8 pages), Japan Patent Office, Tokyo, Japan.

*Primary Examiner* — Lee E Rodak
*Assistant Examiner* — Trung Q Nguyen
(74) *Attorney, Agent, or Firm* — Alston & Bird LLP

(57)   ABSTRACT

A state estimation method for an energy storage device includes: acquiring, by a first method, a first probability distribution that expresses the state of the energy storage device 61 in the form of a probability distribution; acquiring, by a second method, a second probability distribution that expresses the state of the energy storage device in the form of a probability distribution; and estimating the state of the energy storage device on the basis of the first probability distribution and the second probability distribution.

11 Claims, 19 Drawing Sheets

(51) Int. Cl.
*H01M 10/48* (2006.01)
*G01R 31/392* (2019.01)
*G01R 31/36* (2020.01)

(58) Field of Classification Search
USPC ..... 324/76.11, 500, 600, 416, 425–434, 522, 324/713, 72.5, 76.39, 76.77, 98, 111, 120
See application file for complete search history.

(56) References Cited

FOREIGN PATENT DOCUMENTS

| | | | | | |
|---|---|---|---|---|---|
| CN | 106926725 | B | | 11/2019 | |
| JP | 2006-220616 | A | | 8/2006 | |
| JP | 2012-029417 | A | | 2/2012 | |
| JP | 2014-063621 | A | | 4/2014 | |
| JP | 2015-059924 | A | | 3/2015 | |
| JP | WO201541093 | | * | 3/2015 | ........... G01R 31/392 |
| JP | WO2015541093 | | * | 3/2015 | ........... G01R 31/392 |
| JP | 2015-135286 | A | | 7/2015 | |
| JP | 2016-065748 | A | | 4/2016 | |
| WO | WO-2015/041093 | A1 | | 3/2015 | |

* cited by examiner

Fig. 14

| SOH value (k) | (1) 100%~98% | (2) 98%~96% | (3) 96%~94% | (4) 94%~92% | (5) 92%~90% |
|---|---|---|---|---|---|
| Probability at (t-1)th time point ($F_{t-1}(Q_{t-1}=k)$) | 1.0 | 0.0 | 0.0 | 0.0 | 0.0 |
| Probability at t-th time point due to state transition | 0.70 | 0.30 | 0.00 | 0.00 | 0.00 |
| Probability at t-th time point obtained from measurement of characteristic value ($P(o_t \mid Q_t=k)$) | 0.50 | 0.20 | 0.10 | 0.00 | 0.00 |
| Integrated probability | 0.35 | 0.06 | 0.00 | 0.00 | 0.00 |
| Normalized probability at t-th time point ($F_t(Q_t=k)$) | 0.85 | 0.15 | 0.00 | 0.00 | 0.00 |

Fig. 15

| | (1)→(2) | (2)→(3) | (3)→(4) | (4)→(5) |
|---|---|---|---|---|
| State-transition probability | 0.3 | 0.2 | 0.1 | 0.05 |

Fig. 16

| SOH value (k) | (1) 100%~98% | (2) 98%~96% | (3) 96%~94% | (4) 94%~92% | (5) 92%~90% |
|---|---|---|---|---|---|
| Probability at t-th time point ($F_t(Q_t=k)$) | 0.85 | 0.15 | 0.00 | 0.00 | 0.00 |
| Probability at (t+1)th time point due to state transition | 0.60 | 0.37 | 0.03 | 0.00 | 0.00 |
| Probability at (t+1)th time point obtained from measurement of characteristic value ($P(o_{t+1} \mid Q_{t+1}=k)$) | 0.20 | 0.50 | 0.20 | 0.10 | 0.00 |
| Integrated probability | 0.12 | 0.19 | 0.01 | 0.00 | 0.00 |
| Normalized probability at (t+1)th time point ($F_{t+1}(Q_{t+1}=k)$) | 0.38 | 0.60 | 0.02 | 0.00 | 0.00 |

STATE ESTIMATION METHOD AND STATE ESTIMATION APPARATUS

CROSS REFERENCE TO RELATED APPLICATIONS

This application is a national stage application, filed under 35 U.S.C. § 371, of International Application No. PCT/JP2019/024224, filed Jun. 19, 2019, which international application claims priority to and the benefit of Japanese Application No. JP2018-120126, filed Jun. 25, 2018; the contents of both of which as are hereby incorporated by reference in their entireties.

BACKGROUND

Technical Field

The present invention relates to a method for estimating a state of an energy storage device and a state estimation apparatus.

Description of Related Art

An energy storage device has been widely used in an uninterruptible power supply, a d.c. or a.c. power supply included in a stabilized power supply, and the like. In addition, the use of energy storage devices in large-scale systems that store generated electric power is expanding. The energy storage device is degraded in accordance with the passage of time and the repetition of charge and discharge. With the deterioration, the chargeable and dischargeable capacity (full-charge capacity) of the energy storage device gradually decreases, and the internal resistance increases. The full-charge capacity is the amount of electricity stored into the energy storage device at the time of full charge.

In the operation of the energy storage device, it is necessary to estimate and grasp the state of the energy storage device. For example, a state of health (SOH), which indicates the ratio of the capacity of the current energy storage device to the capacity of a new energy storage device, is estimated. The energy storage device is replaced when SOH of the energy storage device becomes low to some extent.

Conventionally, a technique for sequentially estimating SOH on the basis of history data representing a history of an energy storage device has been used. The history data includes information representing a history of the energy storage device, such as a voltage history, a current history, a left-unattended history, or a temperature history. The history data is created by continuously acquiring measured values measured by a sensor such as a voltmeter with respect to the energy storage device. A technique for estimating SOH on the basis of a characteristic value (e.g., internal resistance) of the energy storage device, which can be measured in a relatively short time, has also been proposed. Patent Document JP-A-2006-220616 discloses an example of a technique for estimating SOH on the basis of a characteristic value of the energy storage device by using a neural network operation.

BRIEF SUMMARY

In the method for sequentially estimating SOH of an energy storage device on the basis of history data, SOH of the energy storage device can always be grasped in real time while the operation of the energy storage system is continued normally. However, estimation errors, which are due to the uncertainty of a calculation algorithm for calculating SOH and the uncertainty of input information, accumulate, and the estimation accuracy of SOH tends to decrease gradually. In an energy storage device that operates in a complex charge-discharge pattern, history data becomes complex, and the estimation accuracy of SOH tends to decrease gradually. Since this method depends on measured values continuously acquired by the sensor, it becomes difficult to estimate SOH when a measured value is lost due to noise or the like.

In the method for estimating SOH on the basis of a characteristic value that can be measured in a short time, estimation errors do not accumulate over time. It is also possible to estimate SOH for an energy storage device that operates in a complex charge-discharge pattern. However, the estimation accuracy of SOH greatly depends on the measurement accuracy of the characteristic value. In this method, it is necessary to stop the normal operation of the energy storage system and perform a special operation for measuring the characteristic value of the energy storage device. In this method, it is difficult to always grasp SOH of the energy storage device in real time.

An object of the present invention is to provide a state estimation method and a state estimation apparatus for an energy storage device which can obtain SOH with high robustness.

A state estimation method according to one aspect of the present invention includes: acquiring, by a first method, a first probability distribution that expresses the state of the energy storage device in the form of a probability distribution; acquiring, by a second method, a second probability distribution that expresses the state of the energy storage device in the form of a probability distribution; and estimating the state of the energy storage device on the basis of the first probability distribution and the second probability distribution.

The present inventor has conceived of: (1) treating a degradation phenomenon of an energy storage device as a probability system rather than as a definite system; and (2) acquiring SOH by each of a plurality of methods and deriving SOH with high robustness on the basis of SOH acquired. With the above configuration, SOH can be estimated with high robustness compared to a case where SOH is definitely estimated by an individual method.

BRIEF DESCRIPTION OF THE FIGURES

FIG. 14 is a diagram showing an example of details of obtaining the probability of each SOH at the t-th time point from the probability of each SOH at the (t−1)th time point.

FIG. 15 is a diagram showing an example of state-transition probabilities.

FIG. 16 is a diagram showing an example of details of obtaining the probability of each SOH at a (t+1)th time point from the probability of each SOH at the t-th time point.

DETAILED DESCRIPTION OF VARIOUS EMBODIMENTS

Figure 1:
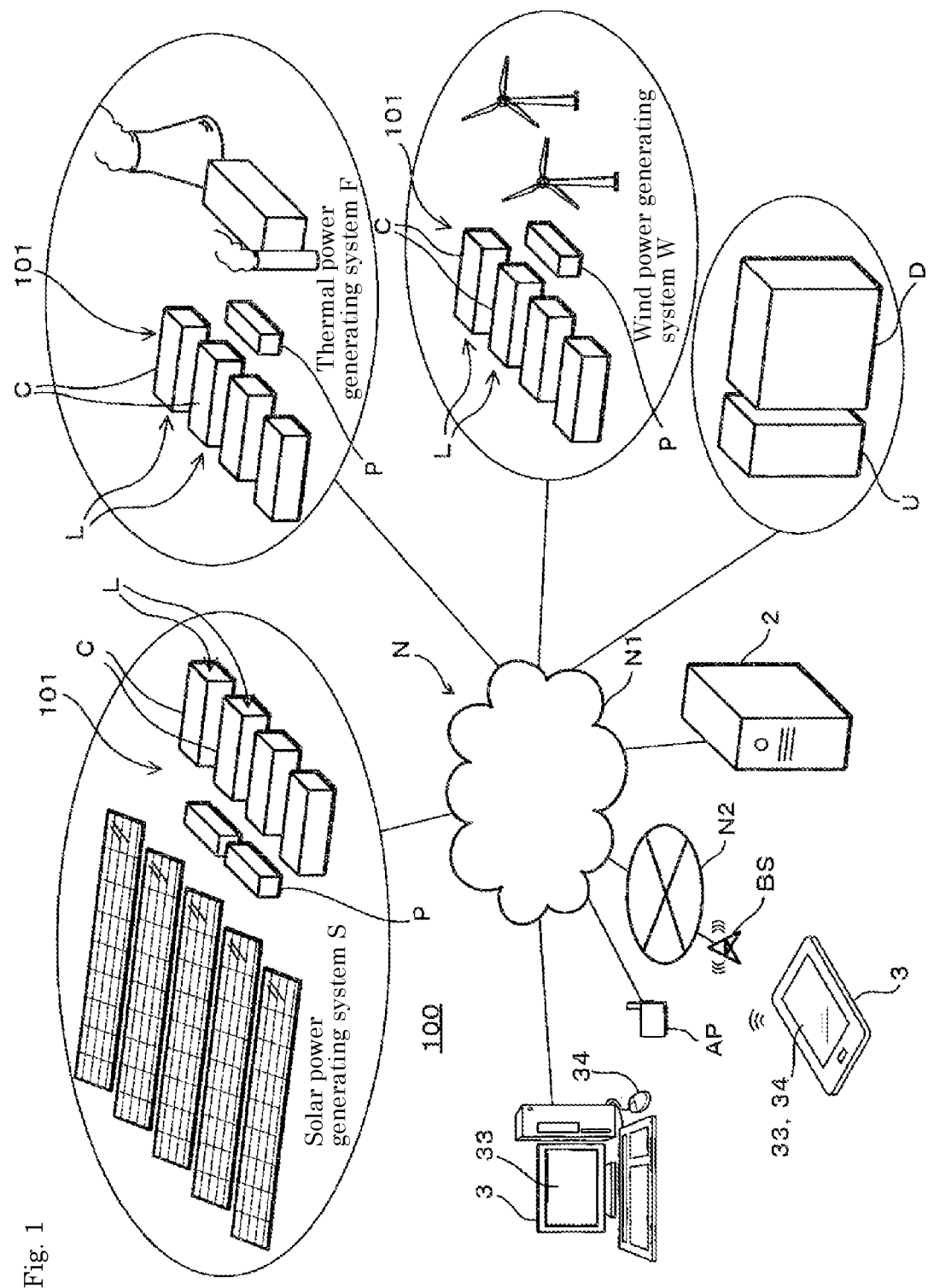
FIG. 1 is a diagram showing an outline of a remote monitoring system.

A state estimation method for an energy storage device includes: acquiring, by a first method, a first probability distribution that expresses the state of the energy storage device in the form of a probability distribution; acquiring, by a second method, a second probability distribution that expresses the state of the energy storage device in the form of a probability distribution; and estimating the state of the energy storage device on the basis of the first probability distribution and the second probability distribution. A state estimation apparatus for estimating a state of an energy storage device includes: a first acquisition unit that acquires, by a first method, a first probability distribution expressing the state of the energy storage device in the form of a probability distribution; a second acquisition unit that acquires, by a second method, a second probability distribution expressing the state of the energy storage device in the form of a probability distribution; and an estimation unit that estimates the state of the energy storage device on the basis of the first probability distribution and the second probability distribution.

The state of the energy storage device is expressed, for example, in the form of a probability distribution indicating the probability that the value of SOH becomes each value between 0 and 1. With the uncertainty, which is existing in the estimated SOH and varying depending on the estimation method, the use of the probability distribution makes it possible to express the value of SOH and the uncertainty corresponding to the estimation method. The first probability distribution of SOH is obtained by the first method, the second probability distribution of SOH is obtained by the second method, and the state of the energy storage device is estimated using the first probability distribution and the second probability distribution in the form of the probability distribution of SOH, for example. By integrating the probability distributions of SOH obtained by the two methods, it is possible to estimate probable SOH with high robustness compared to a case where SOH is definitely estimated by an individual method. For example, even when the uncertainty of SOH estimated by one method is large, the uncertainty of SOH finally estimated can be reduced.

In the state estimation method, a history traced by the energy storage device from a first time point to a second time point may be acquired, and in the first method, the first probability distribution at the second time point may be calculated on the basis of the history. The first acquisition unit may calculate the first probability distribution on the basis of a history traced by the energy storage device. The change in SOH of the energy storage device varies in accordance with the difference in an operation history (including a left-unattended history), such as repeating the charge and discharge or leaving the energy storage device, or the installation environment (temperature history), such as being exposed to high temperature or low temperature. SOH of the energy storage device, which changes from the first time point, can be estimated on the basis of the history.

In the state estimation method, a characteristic value indicating a characteristic of the energy storage device at a specific time point may be measured, and in the second method, the second probability distribution at the specific time point may be acquired on the basis of the characteristic value. The second acquisition unit may acquire the second probability distribution at the specific time point on the basis of a characteristic value indicating a characteristic of the energy storage device at a specific time point. By acquiring SOH on the basis of the characteristic value measured at the specific time point, SOH can be estimated, greatly reducing the influence of an estimation error that occurs at the time of sequentially estimating SOH in accordance with the history.

In the state estimation method, in accordance with a model of a partially observable Markov decision process, the first probability distribution at the second time point may be calculated using the state of the energy storage device at the first time point and a state-transition probability corresponding to a history of the energy storage device from the first time point to the second time point, the second probability distribution may be acquired on the basis of a characteristic value indicating a characteristic of the energy storage device at the second time point, and the state of the energy storage device at the second time point may be estimated from the first probability distribution and the second probability distribution. The first acquisition unit may calculate the first probability distribution at the second time point by using the state of the energy storage device at the first time point and a state-transition probability corresponding to a history of the energy storage device from the first time point to the second time point, the second acquisition unit may acquire the second probability distribution on the basis of a characteristic value indicating a characteristic of the energy storage device at the second time point, and the estimation unit may estimate the state of the energy storage device at the second time point from the first probability distribution and the second probability distribution in accordance with a model of a partially observable Markov decision process. By integrating the probability distribution of SOH obtained in accordance with the state transition and the probability distribution of SOH obtained by measuring the characteristic value, it is possible to reduce the influence of an estimation error that occurs at the time of estimating SOH corresponding to the history. It is possible to estimate SOH of the energy storage device in real time while reducing the influence of an estimation error. Further, by using the probability distribution of SOH obtained by measuring the characteristic value, it is possible to reset the accumulation of estimation errors that occur at the time of estimating SOH corresponding to the history.

The state estimation method may include estimating a state of the energy storage device at a second time point by using a state of the energy storage device at a first time point expressed in the form of a probability distribution and a state-transition probability corresponding to a history, traced by the energy storage device from the first time point to the second time point, or a virtual event. By using the state-transition probability corresponding to the history or virtual event (prediction data), SOH of the energy storage device which changes from the first time point to the second time point can be estimated.

In the state estimation method, the second time point may be a future time point. The state of the energy storage cell at the future time point can be predicted (simulated) on the basis of the state of the energy storage device at the current time point and the state-transition probability corresponding to a virtual event (assumed future event).

The present invention will be described in detail below with reference to the drawings showing the embodiments.

First Embodiment

FIG. 1 is a diagram showing an outline of a remote monitoring system 100. As shown in FIG. 1, a communication network N includes a public communication network (e.g., the Internet) N1, a carrier network N2 that realizes wireless communication based on a mobile communication standard, and the like. A solar power generating system S, a thermal power generating system F, a wind power generating system W, an uninterruptible power supply (UPS) U, a rectifier (d.c. power supply or a.c. power supply) D disposed in a stabilized power supply system for railways, and the like are connected to the communication network N. A communication device 1 to be described later (cf. FIG. 2), a server apparatus 2 for collecting information from the communication device 1, a client apparatus 3 for acquiring the collected information, and the like are connected to the communication network N.

The carrier network N2 includes a base station BS. The client apparatus 3 can communicate with the server apparatus 2 from the base station BS via the communication network N. An access point AP is connected to the public communication network N1. The client apparatus 3 can transmit and receive information from the access point AP to and from the server apparatus 2 via the communication network N.

A power conditioner (power conditioning system: PCS) P and an energy storage system 101 are provided in each of the solar power generating system S, the thermal power generating system F, and the wind power generating system W. The energy storage system 101 is configured by juxtaposing a plurality of containers C each housing an energy storage module group L. The energy storage module group L has a hierarchical structure of, for example, an energy storage module in which a plurality of energy storage cells are connected in series, a bank in which a plurality of energy storage modules are connected in series, and a domain in which a plurality of banks are connected in parallel. The energy storage cell, the energy storage module, or the bank corresponds to an energy storage device. The energy storage device is preferably a rechargeable device, such as a secondary battery like a lead-acid battery or a lithium ion battery, or a capacitor. Some of the energy storage devices may be a non-rechargeable primary battery.

Figure 2:
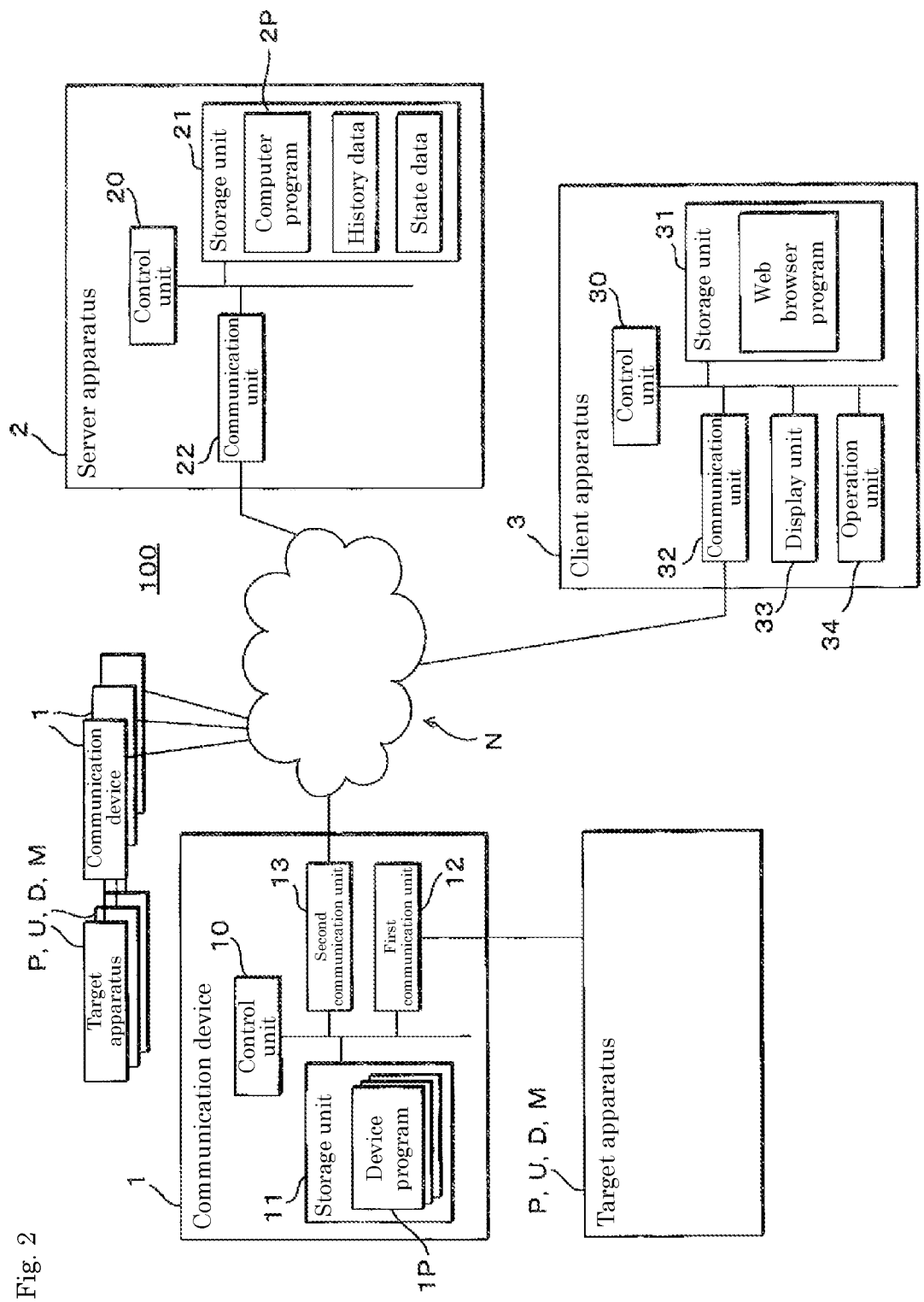
FIG. 2 is a block diagram showing a configuration example of the remote monitoring system.

FIG. 2 is a block diagram showing the configuration example of the remote monitoring system 100. The remote monitoring system 100 includes the communication device 1, the server apparatus 2 for functioning as a state estimation apparatus, the client apparatus 3, and the energy storage system 101 (cf. FIG. 3). The energy storage system 101 includes a management apparatus M to be described later. The management apparatus M manages the energy storage devices included in the energy storage system 101. The energy storage system 101 is not limited to the system attached to the power generating system. The energy storage system 101 may be connected to a power transmission system via the power conditioner P.

As shown in FIG. 2, the communication device 1 is connected to the communication network N and is connected to the target apparatuses P, U, D, M. The target apparatuses P, U, D, M are apparatuses to be managed by the remote monitoring system 100. The target apparatuses P, U, D, M include the power conditioner P, the uninterruptible power supply U, the rectifier D, and the management apparatus M.

In the remote monitoring system 100, the state (e.g., voltage, current, temperature, state of charge (SOC)) of the energy storage device included in the energy storage system 101 is monitored using the communication device 1 connected to each of the target apparatuses P, U, D, M. For example, history data including the histories of the voltage, current, and temperature of the energy storage device, and the ambient temperature is continuously acquired to perform the monitoring. The history data may include an operation history (charge-discharge history) of the energy storage device and/or a left-unattended history indicating a history of leaving the energy storage device without performing the charge and discharge. For the energy storage device for which the history data is being continuously acquired, a degradation state can be estimated on the basis of the history data. The degradation state includes SOH. For example, SOH can be sequentially estimated on the basis of the history data. The remote monitoring system 100 presents the state (including a degraded state, an abnormal state, etc.) of the energy storage device so that a user or an operator (a person in charge of maintenance) can confirm the detected state.

The communication device 1 includes a control unit 10, a storage unit 11, a first communication unit 12, and a second communication unit 13. The control unit 10 is made of a central processing unit (CPU) or the like, and controls the entire communication device 1 by using built-in memories such as read-only memory (ROM) and random-access memory (RAM).

The storage unit 11 is nonvolatile. The storage unit 11 is configured using a nonvolatile memory such as flash memory, for example. The storage unit 11 stores a device program 1P to be read and executed by the control unit 10. The storage unit 11 stores information such as information collected by the processing of the control unit 10 and event logs.

The first communication unit 12 is a communication interface that realizes communication with the target apparatuses P, U, D, M. The first communication unit 12 is configured using, for example, a serial communication interface, such as RS-232C or RS-485. The second communication unit 13 is an interface that realizes communication via the communication network N. The second communication unit 13 is configured using a communication interface such as Ethernet (registered trademark) or a wireless communication antenna, for example. The control unit 10 can communicate with the server apparatus 2 via the second communication unit 13.

The server apparatus 2 includes a control unit 20, a storage unit 21, and a communication unit 22. The server apparatus 2 may be one server computer or may be made up of a plurality of server computers.

The control unit 20 includes, for example, a central processing unit (CPU). The control unit 20 controls the entire server apparatus 2 by using a memory such as a built-in read-only memory (ROM) and a random-access memory (RAM). The control unit 20 may be configured using a CPU and a graphics processing unit (GPU), a multi-core CPU, or a tensor processing unit (TPU). The control unit 20 executes information processing on the basis of a computer program 2P stored in the storage unit 21. The computer program 2P includes a Web server program. The control unit 20 functions as a Web server that performs the provision of a Web page to the client apparatus 3, the acceptance of login to a Web service, and the like. The control unit 20 can also collect information from the communication device 1 as a server for simple network management protocol (SNMP) on the basis of the computer program 2P.

The storage unit 21 may be, for example, a nonvolatile memory such as flash memory or a hard disk. The storage unit 21 stores data including the states of the target apparatuses P, U, D, M to be monitored, which are collected by the processing of the control unit 20. The communication unit 22 is a communication device that realizes the communication connection and the transmission and reception of data via the communication network N. The communication unit 22 may be a network card corresponding to the communication network N. The energy storage unit 21 stores history data on each energy storage device acquired by the remote monitoring system 100. The energy storage unit 21 also stores state data representing the states of the energy storage devices estimated sequentially.

The client apparatus 3 may be a computer used by an operator such as an administrator of the energy storage system 101 or a person in charge of maintenance of the target apparatuses P, U, D, M. The client apparatus 3 may be a desktop type or a laptop type personal computer or may be a smartphone or a tablet type communication terminal. The client apparatus 3 includes a control unit 30, a storage unit 31, a communication unit 32, a display unit 33, and an operation unit 34.

The control unit 30 is a processor using a CPU. A control unit 30 causes a display unit 33 to display a Web page provided by the server apparatus 2 or the communication device 1 based on a Web browser program stored in a storage unit 31.

The storage unit 31 is, for example, a nonvolatile memory such as flash memory or a hard disk. The storage unit 31 stores various programs including a Web browser program. For the communication unit 32, it is possible to use, for example, a communication device such as a network card for wired communication, a wireless communication device for mobile communication connected to a base station BS (see FIG. 1), or a wireless communication device corresponding to connection to the access point AP. The control unit 30 can be communicably connected to, or transmit and receive information to and from, the server apparatus 2 or the communication device 1 via the communication network N by using the communication unit 32.

For the display unit 33, a display such as a liquid crystal display or an organic electroluminescence (EL) display may be used. The display unit 33 can display an image of a Web page provided by the server apparatus 2 by processing based on the Web browser program of the control unit 30.

The operation unit 34 is a user interface, such as a keyboard and a pointing device, capable of input and output with the control unit 30 or a voice input unit. A touch panel of the display unit 33 or a physical button provided in the housing may be used as the operation unit 34. The operation unit 34 notifies the control unit 30 of information of an operation by the user.

Figure 3:
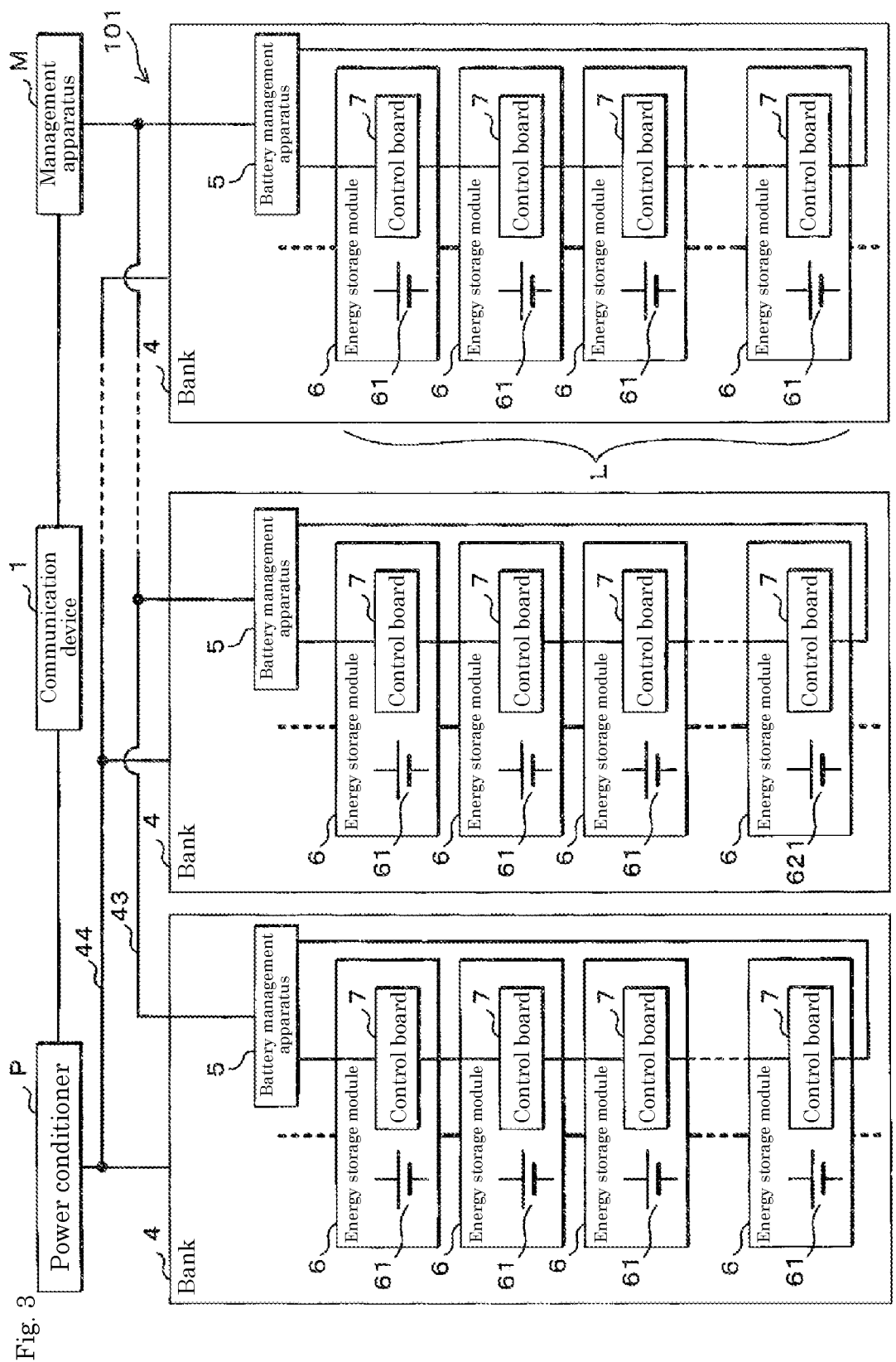
FIG. 3 is a block diagram showing a configuration example of the energy storage system.

FIG. 3 is a block diagram showing a configuration example of the energy storage system 101. The energy storage system 101 has a hierarchical structure of an energy storage module 6 in which a plurality of energy storage cells 61 are connected in series, a bank 4 in which a plurality of energy storage modules 6 are connected in series, and a domain in which a plurality of banks 4 are connected in parallel. The energy storage system 101 shown in FIG. 3 constructs one domain. The energy storage module 6 may include an energy storage cell 61 connected in parallel to another energy storage cell 61. The bank 4 may include an energy storage module 6 connected in parallel to another energy storage module 6.

The voltage, current, and temperature of the energy storage cell 61, and the ambient temperature are continuously acquired, and the history data including the histories of the voltage, current, temperature, and ambient temperature is stored into the management apparatus M or the server apparatus 2 as needed, whereby the energy storage cell 61 is monitored. The energy storage cell 61 may be an energy storage cell 61 that has been continuously monitored from the initial use (the initial operation of the energy storage system 101) and has acquired the history data. In the energy storage system 101, the energy storage cell 61 may be an energy storage cell 61 that has not been monitored so far, may be an energy storage cell 61 in which the history data has been lost, or may be an energy storage cell 61 newly added to the energy storage system 101 in a state in which the history data is unknown.

The energy storage system 101 is connected to the power conditioner P. Each bank 4 is connected to the power conditioner P via a power line 44. Power is supplied to the bank 4 through the power conditioner P to charge the bank 4. The power released from the bank 4 is output to the outside through the power conditioner P. For example, the power conditioner P is connected to the power generating system and/or the power transmission system.

Each bank 4 includes a plurality of energy storage modules 6 and a battery management apparatus (battery management unit: BMU) 5. Each energy storage module 6 includes a control board (cell monitoring unit: CMU) 7. The control board 7 is connected to the battery management apparatus 5. The battery management apparatus 5 can communicate with each control board 7.

An energy storage system 101 is provided with a management apparatus M. The management apparatus M is a BMU that manages an energy storage device belonging to a domain. The battery management apparatus 5 provided in each bank 4 is connected to the management apparatus M via a communication line 43. The communication device 1 is connected to the management apparatus M and/or a power conditioner P. The communication device 1 may include a communication device connected to the management apparatus M and a communication device connected to the power conditioner P. The battery management apparatus 5 transmits and receives information to and from the management apparatus M. The management apparatus M aggregates information from a plurality of battery management apparatuses 5 and outputs the information to the communication device 1. A temperature acquisition unit (not shown) may acquire the ambient temperature of the domain (the outside air temperature or the temperature inside a room where the energy storage devices are installed) or the ambient temperature of each bank.

Figure 4:
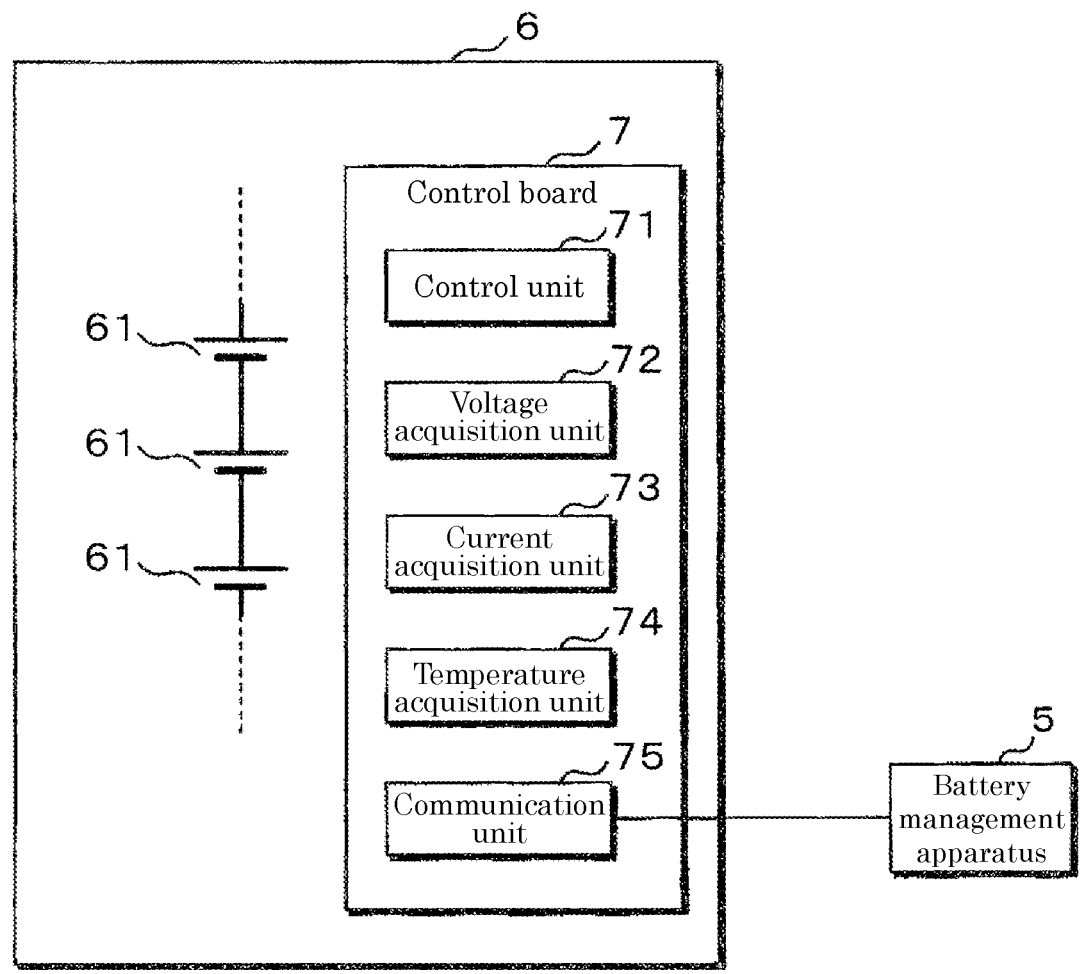
FIG. 4 is a block diagram showing a configuration example of the energy storage module.

FIG. 4 is a block diagram showing a configuration example of the energy storage module 6. The control board 7 includes a control unit 71, a voltage acquisition unit 72, a current acquisition unit 73, a temperature acquisition unit 74, and a communication unit 75. The control unit 71 is configured using a processor and a memory. The control unit 71 controls the operation of the control board 7. The voltage acquisition unit 72 acquires the voltage of each of the energy storage cells 61. The current acquisition unit 73 acquires the current flowing through the energy storage cells 61. For example, the current acquisition unit 73 acquires the current flowing through the plurality of energy storage cells 61 connected in series or acquires the current flowing through each of the energy storage cells 61 individually. The temperature acquisition unit 74 acquires the temperature at one or more points in the energy storage module 6 by using a temperature sensor. The temperature acquisition unit 74 may acquire the temperature outside each energy storage cell 61.

The communication unit 75 is connected to the battery management apparatus 5. The communication unit 75 has a function of performing serial communication with the battery management apparatus 5, for example. The control unit 71 causes the communication unit 75 to transmit information indicating the acquired voltage, current, and temperature to the battery management apparatus 5.

Figure 5:
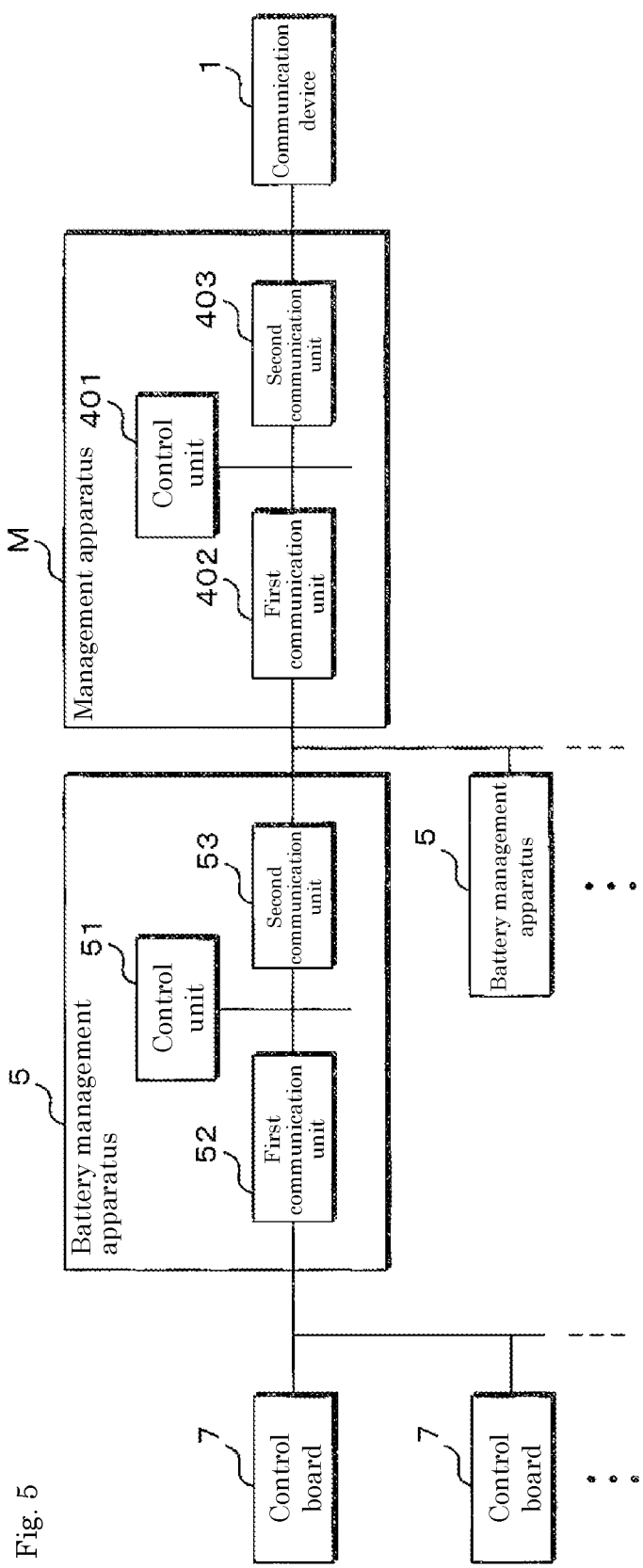
FIG. 5 is a block diagram showing an example of a functional configuration of a battery management apparatus and the management apparatus.

FIG. 5 is a block diagram showing a functional configuration example of the battery management apparatus 5 and the management apparatus M. The battery management apparatus 5 includes a control unit 51, a first communication unit 52, and a second communication unit 53. The control unit 51 is a processor using a CPU. The first communication unit 52 is connected to a plurality of control boards 7 in the bank 4. The first communication unit 52 receives information transmitted from the control board 7. The second communication unit 53 is connected to the management apparatus M via the communication line 43 (cf. FIG. 3). The control unit 51 causes the second communication unit 53 to transmit the information, received from the plurality of control boards 7, to the management apparatus M.

The management apparatus M is configured using a computer. The management apparatus M includes a control unit 401, a first communication unit 402, and a second communication unit 403. The control unit 401 is a processor using a CPU. The first communication unit 402 is connected to a plurality of battery management apparatuses 5. The first communication unit 402 receives information transmitted from the battery management apparatuses 5. The second communication unit 403 is connected to the communication device 1. The control unit 401 causes the second communication unit 403 to transmit the information, received from the plurality of battery management apparatuses 5, to the communication device 1. The communication device 1 transmits the information, received from the management apparatus M, to the server apparatus 2. That is, the management apparatus M transmits information to the server apparatus 2 via the communication device 1, and the battery management apparatus 5 transmits information to the server apparatus 2 via the management apparatus M and the communication device 1.

The server apparatus 2 continuously acquires history data of each energy storage cell 61. In each energy storage module 6, as needed, the voltage acquisition unit 72 acquires the voltage of each energy storage cell 61, the current acquisition unit 73 acquires the current flowing through the energy storage cell 61, and the temperature acquisition unit 74 acquires the temperature in the storage module 6. A control unit 71 causes the communication unit 75 to transmit information indicating the acquired voltage, current, and temperature. The information indicating the voltage, current, and temperature is transmitted to the server apparatus 2 via the battery management apparatus 5, the management apparatus M, a communication apparatus 1, and a communication network N.

The server apparatus 2 receives information indicating the voltage, current, and temperature of each energy storage cell 61 in the communication unit 22, and the control unit 20 stores the received information in a storage unit 21. The acquisition of the voltage, current, and temperature of each energy storage cell 61 and the storage of information indicating the voltage, current, and temperature are performed continuously (e.g., periodically). Alternatively, information indicating the voltage, current, and temperature acquired a plurality of times for each energy storage cell 61 may be collectively transmitted and stored. In this manner, history data including the histories of the voltage, current, temperature of each energy storage cell 61, and the ambient temperature is continuously acquired and stored into the server apparatus 2. For example, history data since the start of operation of each energy storage cell 61 is stored into the energy storage unit 21 of the server apparatus 2. Alternatively, the history data may be stored into a storage apparatus other than the server apparatus 2.

SOH of the energy storage cell 61 can be estimated from the history data. For example, each time the charge and discharge are performed, SOH decreases in accordance with the voltage and the current related to the charge and discharge. Even when the energy storage cell 61 is left without the charge and discharge, SOH decreases in accordance with the elapsed time. SOH can be sequentially estimated on the basis of the history data continuously acquired. However, there is uncertainty in the estimated SOH due to accumulated estimation errors and the like.

The server apparatus 2 can measure, in a short time, a characteristic value indicating the characteristic of the energy storage cell 61. The control board 7 acquires behavior data including voltage, current, temperature, and the like of the energy storage cell 61 under specific conditions for a predetermined period, such as 60 seconds, and transmits the acquired behavior data to the server apparatus 2. The server apparatus 2 receives the behavior data in the communication unit 22 and causes the control unit 20 to store the received behavior data into the storage unit 21. The control unit 20 calculates the characteristic value of the energy storage cell 61 on the basis of the behavior data. The characteristic value is, for example, direct current resistance (DCR) inside the energy storage cell 61.

SOH of the energy storage cell 61 can be estimated from the characteristic value of the energy storage cell 61. For example, data representing the correspondence relationship between DCR of the energy storage cell 61 and the actually measured SOH is stored in the energy storage unit 21, and SOH of the energy storage cell 61 can be estimated on the basis of the measured DCR and the stored correspondence relationship. There is also uncertainty in SOH estimated by this method.

In the present embodiment, the degradation phenomenon of the energy storage device is treated as a probability system. The estimated state of the energy storage device can be obtained in the form of a probability distribution indicating the probability that the value of SOH becomes each value between 0 and 1. SOH of the energy storage cell 61 is determined by a partially observable Markov decision process. The probability distribution of SOH is sequentially estimated, and a Markov property is assumed for SOH. Under the condition where the Markov property is assumed, SOH estimated at a t-th time point is influenced by SOH estimated at a (t−1)th time point and is not influenced by SOH estimated at an earlier time point. t is a natural number of 1 or more. The characteristic value is measured at the t-th time point. SOH at the t-th time point is determined on the basis of SOH at the (t−1)th time point, the state transition corresponding to the history of the energy storage cell 61 from the (t−1)-th time point to the t-th time point, and the characteristic value measured at the t-th time point.

k and j are assumed to be real numbers between 0 and 1. The value of SOH at the t-th time point is referred to as $Q_t$, and the probability that the value of SOH is k at the t-th time point is referred to as $F_t(Q_t=k)$. The state of the energy storage cell 61 at the t-th time point is obtained in the form of a probability distribution made of $F_t(Q_t=k)$ corresponding to each of k=0 to 1. The state of the energy storage cell 61 at the (t−1)th time point is obtained in the form of a probability distribution made of $F_{t-1}(Q_{t-1}=k)$ corresponding to each of k=0 to 1. The (t−1)th time point corresponds to the first time point, and the t-th time point corresponds to the second time point.

The state of the energy storage cell 61 transitions in accordance with the operation history of the energy storage cell 61 from the (t−1)th time point to the t-th time point. When the operation history of the energy storage cell 61 from the (t−1)th time point to the t-th time point is $a_{t-1}$, a state-transition probability, which is a probability that the state of the energy storage cell 61 transitions so that the value of SOH that was j at the (t−1)th time point becomes k at the t-th time point, is referred to as $P(Q_t=k|Q_{t-1}=j, a_{t-1})$. The probability that the value of SOH becomes k at the t-th time point due to the state transition is $\Sigma_j P(Q_t=k|Q_{t-1}=j, a_{t-1}) \cdot F_{t-1}(Q_{t-1}=j)$. The probability distribution, made of this probability corresponding to each of k=0 to 1, corresponds to the first probability distribution.

The characteristic value of the energy storage cell 61 measured at the t-th time point is referred to as $o_t$. The probability that the value of SOH becomes k when the characteristic value $o_t$ is obtained is referred to as $P(o_t|Q_t=k)$. The probability distribution, made of this probability corresponding to each of k=0 to 1, corresponds to the second probability distribution. In the model of the partially observable Markov decision process, the probability $F_t(Q_t=k)$ that the value of SOH is k at the t-th time point is expressed by Equation (1) below. By obtaining $F_t(Q_t=k)$ for each of k=0 to 1, the state of the energy storage cell 61 at the t-th time point is obtained in the form of the probability distribution of SOH.

$$F_t(Q_t=k)=P(o_t|Q_t=k)\Sigma_j P(Q_t=k|Q_{t-1}=j,a_{t-1})\cdot F_{t-1}(Q_{t-1}=j) \quad (1)$$

Figure 6:
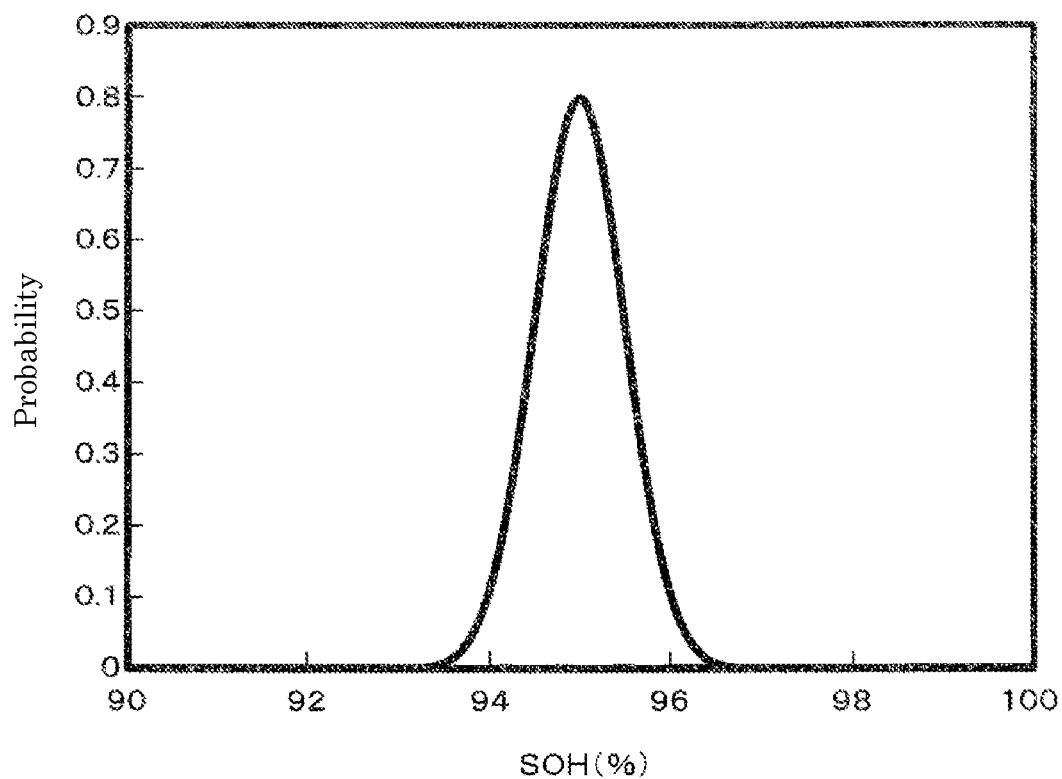
FIG. 6 is a graph showing an example of a state of an energy storage cell at (t−1)th time point.

The process of obtaining the state of the energy storage cell 61 at the t-th time point will be described using a graph. FIG. 6 is a graph showing an example of the state of the energy storage cell 61 at the (t−1)th time point. The horizontal axis represents the value of SOH in %, and the vertical axis represents the probability that SOH becomes each value. SOH is obtained in the form of a probability distribution. The probability distribution of SOH may be a normal distribution. The example shown in FIG. 6 is a normal distribution with an average value of 95%.

Figure 7:
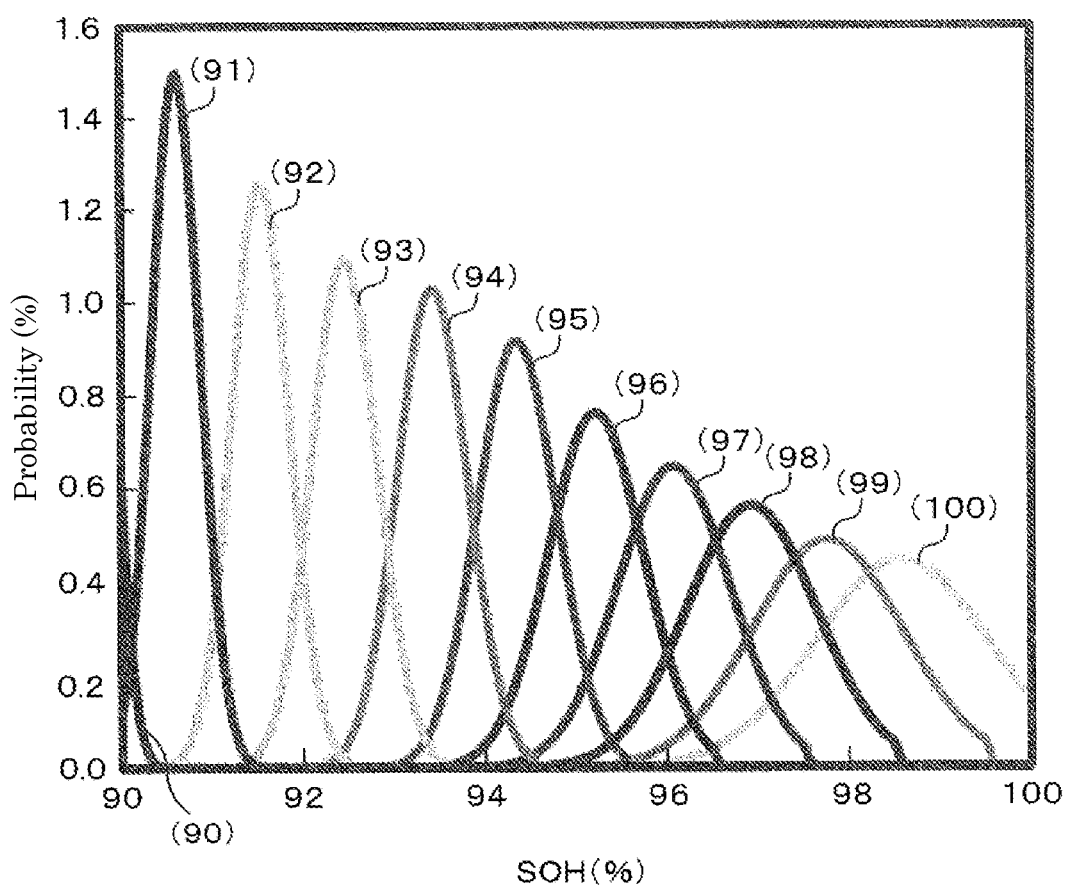
FIG. 7 is a graph showing an example of state-transition probabilities.

FIG. 7 is a graph showing an example of state-transition probabilities. The horizontal axis represents the value of SOH in %. The vertical axis represents the probability that the value of SOH transitions from the value shown on the horizontal axis. The graph denoted by (91) in FIG. 7 shows $P(Q_t=k|Q_{t-1}=91, a_{t-1})$ and shows the probability of transition from a state where the value of SOH is 91% at the (t−1)th time point to a state where the value of SOH is a value (k) indicated on the horizontal axis at the t-th time point. The graphs denoted by (90) and (92) to (99) in the figure show the same probabilities. The content of the state-transition probability corresponds to the operation history $a_{t-1}$ of the energy storage cell 61 from the (t−1)th time point to the t-th time point. The example shown in FIG. 7 is an example in which the content of the operation history $a_{t-1}$ of the energy storage cell 61 is content in which the energy storage cell 61 is left for one month in a state where SOC is 80% and the temperature is 35° C.

Figure 8:
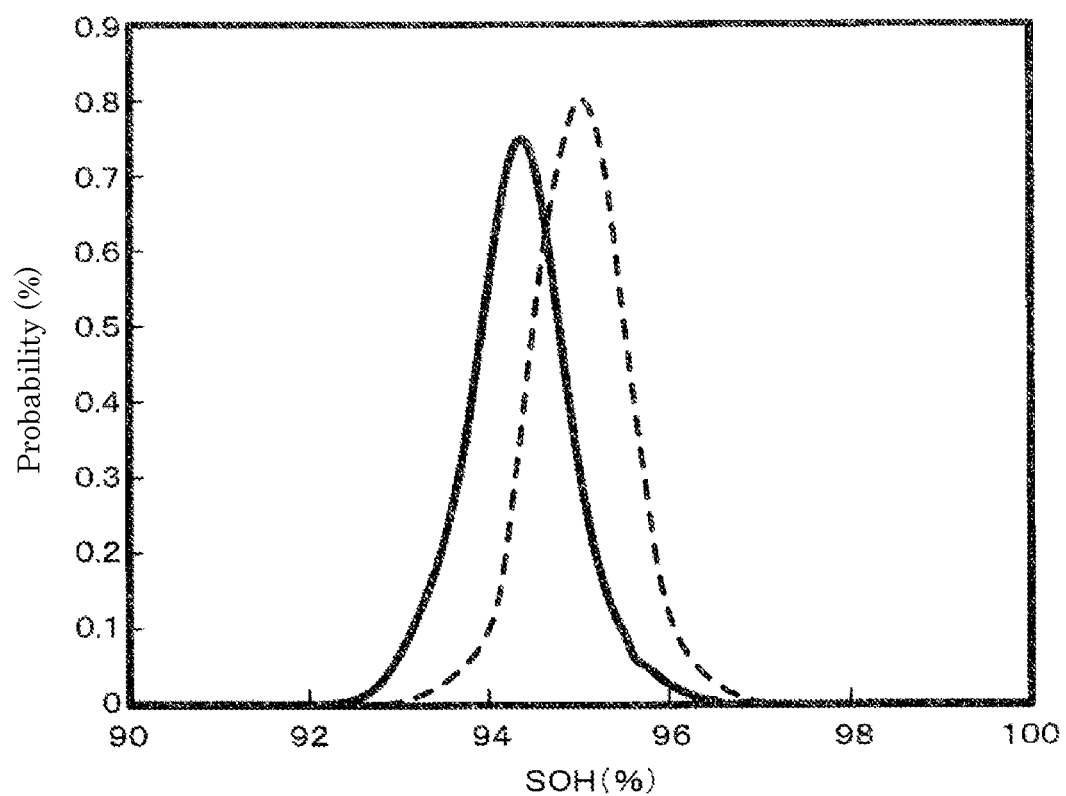
FIG. 8 is a graph showing an example of a state of an energy storage cell at a t-th time point obtained in accordance with state transition.

FIG. 8 is a graph showing an example of the state of the energy storage cell 61 at the t-th time point obtained in accordance with state transition. The horizontal axis represents the value of SOH in %, and the vertical axis represents the probability that SOH becomes each value. In FIG. 8, the state of the energy storage cell 61 at the (t−1)th time point shown in FIG. 6 is indicated by a broken line, and the state of the energy storage cell 61 at the t-th time point obtained in accordance with the state transition is indicated by a solid line. The value of the probability corresponding to the value of each SOH corresponds to $\Sigma_j P(Q_t=k|Q_{t-1}=j, a_{t-1}) \cdot F_{t-1}(Q_{t-1}=j)$ in Equation (1) For example, the probability after the transition from SOH=95% to 94% is obtained by multiplying the value corresponding to SOH=95% in FIG. 6 by the value corresponding to SOH=94% on the graph denoted by (95) in FIG. 7. The value corresponding to SOH=94% in FIG. 8 can be calculated by performing the same calculation even for values except for SOH=95% and taking the sum of the values obtained by the calculation. The values on the graph have been normalized. As shown in FIG. 8, due to the state transition corresponding to the operation history $a_{t-1}$, the value of SOH decreases and its variation increases. The probability distribution shown in FIG. 8 corresponds to the first probability distribution.

Figure 9:
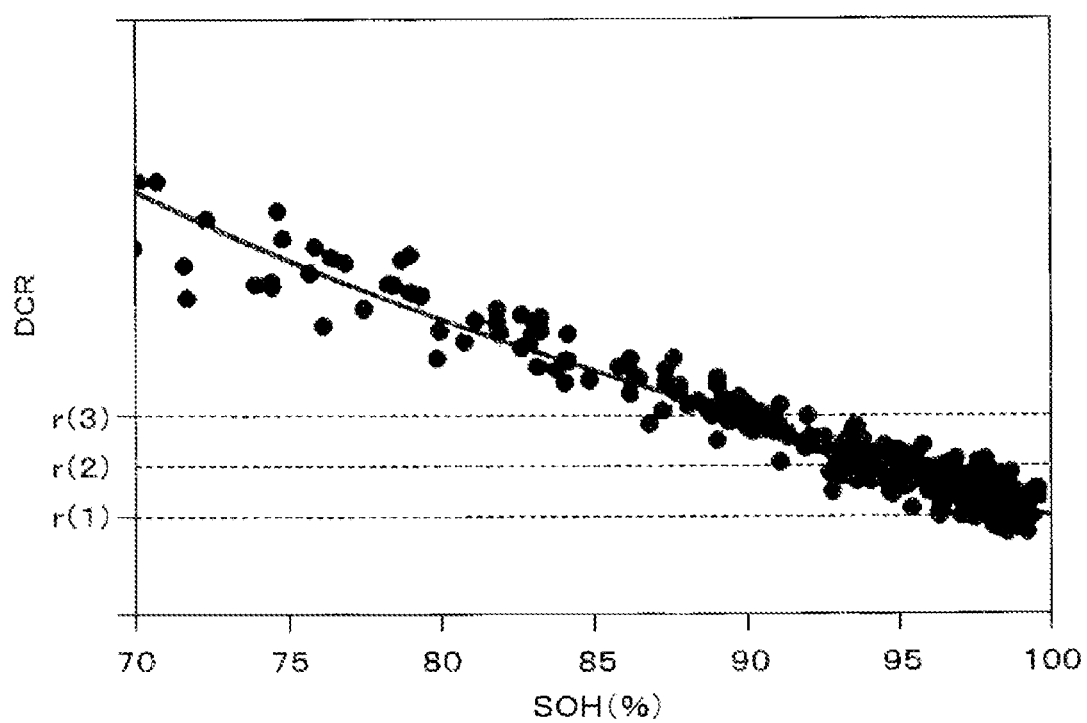
FIG. 9 is a graph showing an example of a relationship between direct current resistance (DCR) and SOH of the energy storage cell.

DCR is given as an example of the characteristic value of the energy storage device. FIG. 9 is a graph showing an example of the relationship between DCR and SOH of the energy storage cell 61. The horizontal axis represents the value of SOH in %, and the vertical axis represents DCR of the energy storage cell 61. The example shown in FIG. 9 is an experimental result of separately measuring DCR and SOH of the energy storage cell 61. The points in the figure indicate the experimental result, and the curve is a curve obtained by approximating the relationship between DCR and SOH on the basis of the experimental result. There is a correlation between DCR and SOH. However, the values of SOH corresponding to respective DCR vary.

Figure 10:
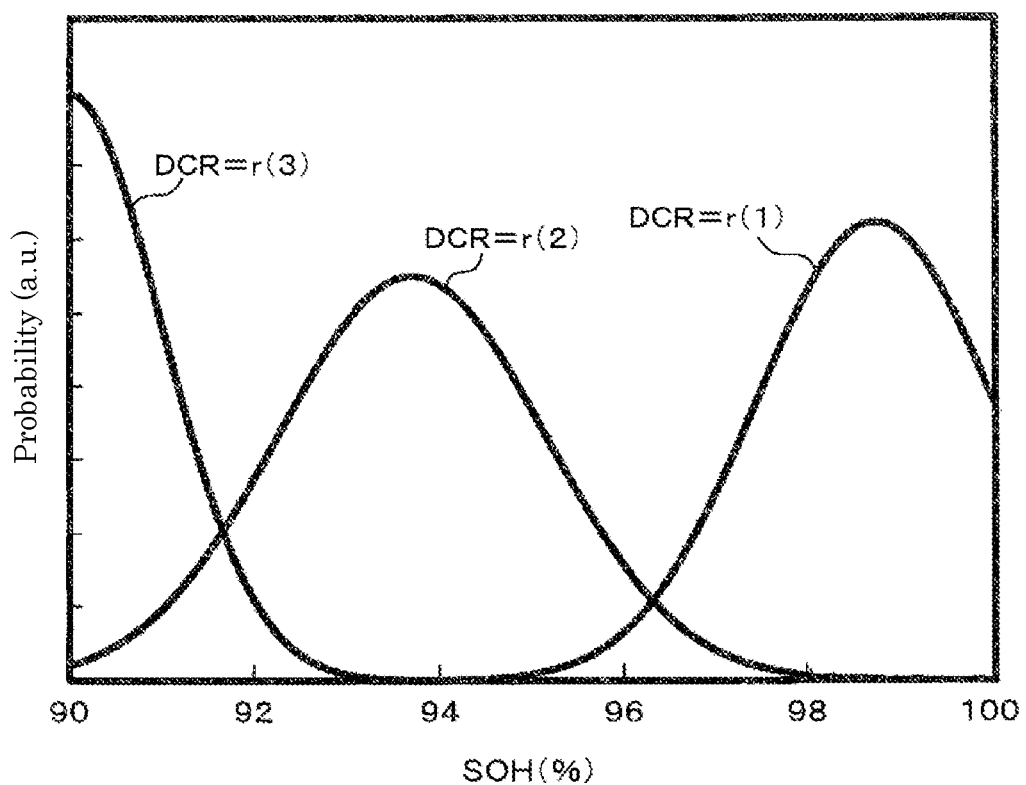
FIG. 10 is a graph showing an example of the state of the energy storage cell obtained by measuring a characteristic value.

FIG. 10 is a graph showing an example of the state of the energy storage cell 61 obtained by measuring the characteristic value. The horizontal axis represents the value of SOH in %, and the vertical axis represents the probability that SOH becomes each value in arbitrary unit (a.u.). The example shown in FIG. 10 is an example obtained from the experimental result shown in FIG. 9. FIG. 10 shows each of the examples in which the values of DCR are r(1), r(2), and r(3). As shown in FIG. 9 and FIG. 10, the value of SOH increases as the value of DCR decreases. Further, there is uncertainty in the value of SOH with respect to DCR, and the state of the energy storage cell 61 is represented by the probability distribution of SOH. The probability distribution shown in FIG. 10 corresponds to the second probability distribution. In addition, the value of DCR acquired during the actual operation of the energy storage cell 61 also contains uncertainty. The second probability distribution may be calculated in consideration of the certainty of the value of DCR.

Figure 11:
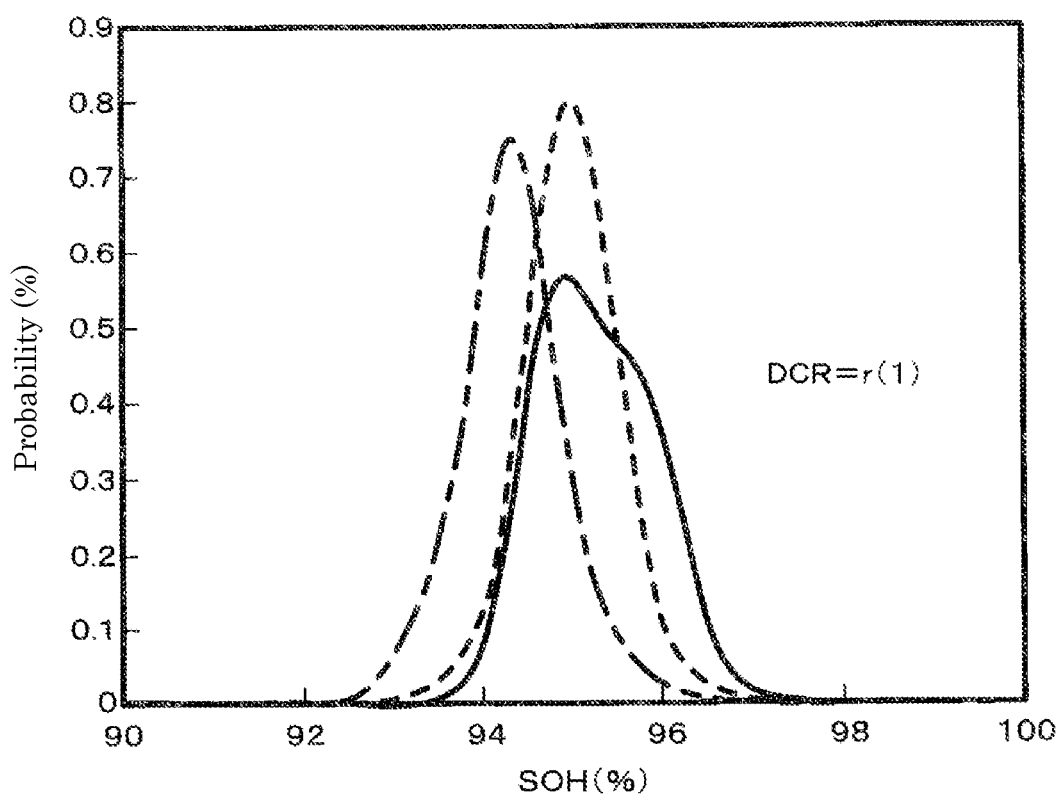
FIG. 11 is a graph showing a first example of an estimated state of the energy storage cell at a t-th time point.
Figure 12:
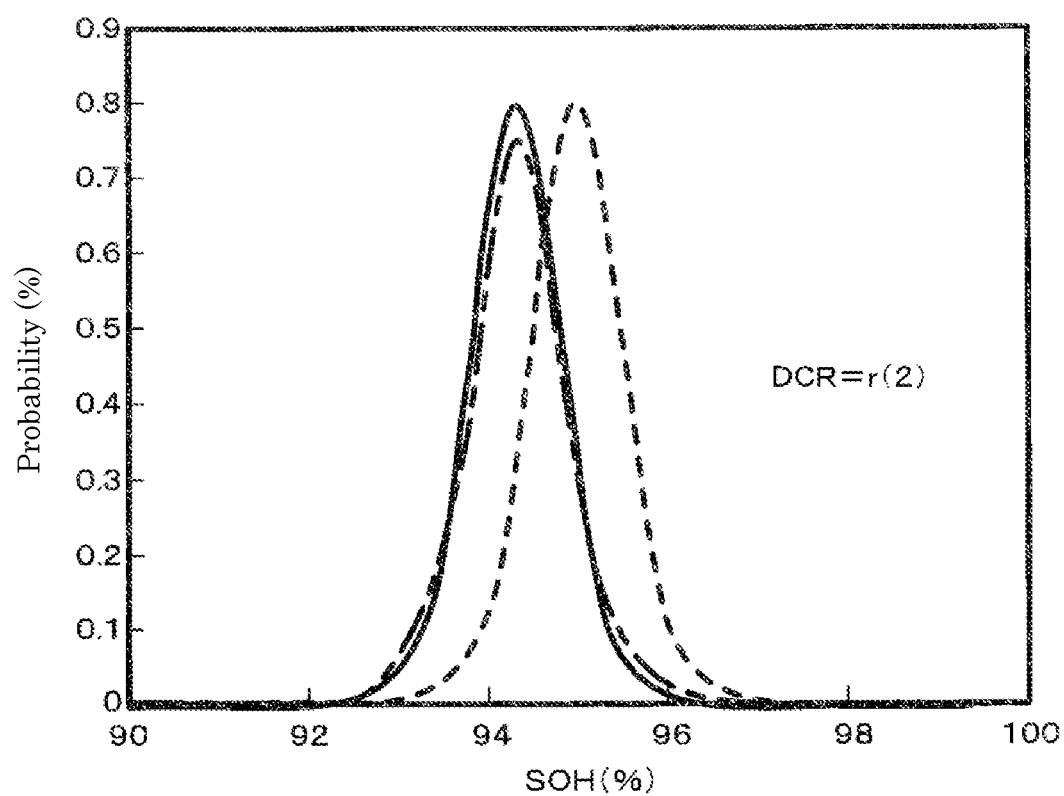
FIG. 12 is a graph showing a second example of the estimated state of the energy storage cell at the t-th time point.
Figure 13:
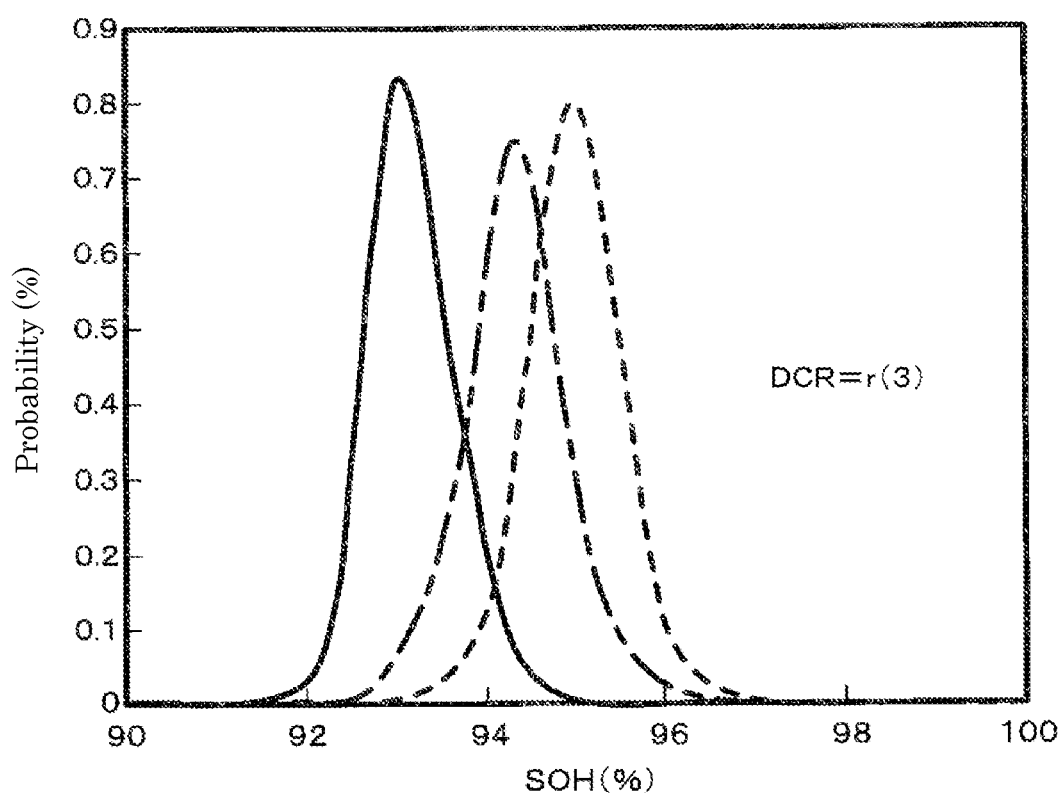
FIG. 13 is a graph showing a third example of the estimated state of the energy storage cell at the t-th time point.

FIG. 11 is a graph showing a first example of an estimated state of the energy storage cell 61 at the t-th time point. FIG. 12 is a graph showing a second example of the estimated state of the energy storage cell 61 at the t-th time point, and FIG. 13 is a graph showing a third example of the estimated state of the energy storage cell 61 at the t-th time point. The horizontal axis of each figure represents the value of SOH in %, and the vertical axis represents the probability that SOH becomes each value. The state of the energy storage cell 61 at the (t−1)th time point shown in FIG. 6 is indicated by a broken line, and the state of the energy storage cell 61 at the t-th time point obtained in accordance with the state transition, shown in FIG. 8, is indicated by a dashed line. The value of the probability corresponding to the value of each SOH corresponds to $F_t(Q_t=k)$ obtained by Equation (1). The value of the probability corresponding to the value of each SOH is a normalized value obtained by multiplying the value on the graph shown in FIG. 6 and the value on the graph shown in FIG. 8 by the value corresponding to the same the value of SOH.

FIG. 11 shows the state of the energy storage cell 61 when the value of DCR measured at the t-th time point is r(1). As shown in FIG. 11, when the value of DCR is r(1), it is estimated that the value of SOH is larger in the state of the energy storage cell 61 at the t-th time point than that in the state at the (t−1)th time point. In the calculation using the second probability distribution, the first probability distribution to be used in the calculation is calculated from the immediately preceding history. That is, the first probability distribution and the second probability distribution are calculated basically at the same time point (from the (t−1)th time point to the t-th time point). However, while the first probability distribution is sequentially calculated, the second probability distribution need not be sequentially calculated. For example, in the state estimation method, when the characteristic value is obtained, the second probability distribution is acquired, and the first probability distribution is corrected.

FIG. 12 shows the state of the energy storage cell 61 when the value of DCR measured at the t-th time point is r(2). As shown in FIG. 12, when the value of DCR is r(2), the value of SOH in the state of the energy storage cell 61 at the t-th time point is almost the same as that in the state of the energy storage cell 61 estimated in accordance with the state transition. Also, because the variation in the value of SOH obtained by the measurement of DCR is small, the variation in the value of SOH in the state of the energy storage cell 61 at the t-th time point is smaller than in the state of the energy storage cell 61 estimated in accordance with the state transition.

FIG. 13 shows the state of the energy storage cell 61 when the value of DCR measured at the t-th time point is r(3). As shown in FIG. 13, when the value of DCR is r(3), it is estimated that the value of SOH is smaller in the state of the energy storage cell 61 at the t-th time point than that in the state at the (t−1)th time point.

As described above, in the present embodiment, the state of the energy storage cell 61 is acquired in the form of the probability distribution indicating the probability that SOH becomes each value. The state of the energy storage cell 61 at the t-th time point is estimated on the basis of the state transition from the state at the (t−1)th time point and the state of the energy storage cell 61 obtained from the characteristic value measured at the t-th time point. By integrating the probability distributions of SOH obtained from the two methods and each having variation, more probable SOH can be obtained. During the operation of the energy storage cell 61, the method for obtaining the first probability distribution and the second probability distribution may be changed. For example, when DCR is used as the characteristic value, the second probability distribution may be calculated using the discharge capacity as the characteristic value at the next time point. When the method for obtaining the second probability distribution is changed in this way, the second probability distribution becomes a narrow distribution with SOH acquired at the center.

Next, a method for estimating the state of the energy storage cell 61 will be described using specific numerical values. FIG. 14 is a diagram showing an example of the details of obtaining the probability of each SOH at the t-th time point from the probability of each SOH at the (t−1)th time point. The ranges in which the values of SOH are 100% to 98%, 98% to 96%, 96% to 94%, 94% to 92%, and 92% to 90% are defined as a range (1), a range (2), a range (3), a range (4), and a range (5), respectively. At the (t−1)th point, the probability that the value of SOH is in the range (1) is assumed to be 1.0, and the probability that the value of SOH is in another range is assumed to be 0.

FIG. 15 is a diagram showing an example of the state-transition probability. For example, the content of the operation history $a_{t-1}$ of the energy storage cell 61 is that the energy storage cell 61 is left in a state where the SOC is 100% for one month. The probability that the value of SOH transitions from the range (1) to the range (2) is assumed to be 0.3. The probability that the value of SOH transitions from the range (2) to the range (3) is assumed to be 0.2, the probability that the value of SOH transitions from the range (3) to the range (4) is assumed to be 0.1, and the probability that the value of SOH transitions from the range (4) to the range 5 is assumed to be 0.05. In this example, for simplification, it is assumed that only the transition from a certain range to the range where the value of SOH is one step lower occurs. For example, the transition from the range (1) to any of the ranges (2), (3), (4), and (5) may occur, but in this example, it is assumed the transition from the range (1) to the range (2) occurs, and the transition to other ranges does not occur.

Since the probability of transition of the value of SOH from the range (1) to the range (2) due to the state transition is 0.3, the probability that the value of SOH is included in the range (1) at the t-th time point obtained in accordance with the state transition is 0.7 (=1.0×(1-0.3)), as shown in FIG. 14. The probability that the value of SOH is in the range (2) at the t-th time point obtained in accordance with the state transition is 0.3.

The characteristic value of the energy storage cell 61 is measured at the t-th time point, and the state of the energy storage cell 61 corresponding to the characteristic value is acquired. For example, DCR of the energy storage cell 61 is measured, and the probability distribution of SOH corresponding to DCR is acquired. For example, the probability distribution of SOH may be a normal distribution centered on the value of SOH corresponding to the measured characteristic value. As shown in FIG. 14, the probabilities that the value of SOH at the t-th time point, obtained by measuring the characteristic value, is included in the range (1), the range (2), the range (3), the range (4), and the range 5 at the t-th time point, are assumed to be 0.5, 0.2, 0.1, 0.0, and 0.0, respectively.

By integrating the probability obtained in accordance with the state transition and the probability obtained by the measurement of the characteristic value, the probability that the value of SOH is included in the range (1) and the range (2) becomes 0.35 (=0.7×0.5) and 0.06 (=0.3×0.2), respectively. The probability that the value of SOH is included in the other range becomes 0. As shown in FIG. 14, when the probability is normalized, the probabilities that the value of SOH is included in the range (1) and the range (2) become 0.85 and 0.15, respectively. This probability distribution represents the state of the energy storage cell 61 at the t-th time point.

The probability that the value of SOH is included in the range (1) at the t-th time point is 0.85, which is larger than the probability of 0.7 obtained in accordance with the state transition and the probability of 0.5 obtained by the measurement of the characteristic value. When both the estimation result of SOH obtained in accordance with the state transition and the estimation result of SOH obtained by the measurement of the characteristic value are correct, the estimation result of the state of the energy storage device indicates the probability that SOH becomes an actual value with a higher value than the result of only the estimation in accordance with the state transition or the result of only the estimation by the measurement of the characteristic value.

FIG. 16 is a diagram showing an example of details of obtaining the probability of each SOH at the (t+1)th time point from the probability of each SOH at the t-th time point. The probability of each SOH changes from the value at the t-th time point due to the state transition. As shown in FIG. 15, the probability that the value of SOH changes from the range (1) to the range (2) due to the state transition is 0.3, and the probability that the value of SOH changes from the range (2) to the range (3) is 0.2. The probability that the value of SOH at the t-th time point, obtained in accordance with the state transition, is included in the range (1) is 0.6 (=0.85×(1−0.3)), as shown in FIG. 16. The probability that the value of SOH at the t-th time point, obtained in accordance with the state transition, is included in the range (2) is 0.37 (=0.85×0.3+0.15×(1−0.2)), as shown in FIG. 14. The probability that the value of SOH at the t-th time point, obtained in accordance with the state transition, is included in the range (3) is 0.03 (=0.15×0.2).

The characteristic value of the energy storage cell 61 is measured at the (t+1)th time point, and the state of the energy storage cell 61 corresponding to the characteristic value is acquired. As shown in FIG. 16, the probabilities that the value of SOH at the t-th time point, obtained by measuring the characteristic value, is included in the range (1), the range (2), the range (3), the range (4), and the range 5 at the t-th time point, are assumed to be 0.2, 0.5, 0.2, 0.1, and 0.0, respectively. The probability obtained in accordance with the state transition and the probability obtained by the measurement of the characteristic value are integrated. The probabilities that the value of SOH is included in the range (1), the range (2), and the range (3) are set to 0.12 (=0.6×0.2), 0.19 (=0.37×0.5) and 0.01 (=0.03×0.2), respectively. The probability that the value of SOH is included in the other range becomes 0. As shown in FIG. 16, when the probability is normalized, the probabilities that the value of SOH is included in the range (1), the range (2), and the range (3) become 0.38, 0.60, and 0.02, respectively. This probability distribution represents the state of the energy storage cell 61 at the (t+1)th time point.

When the state of the energy storage cell 61 at each of the t-th and (t+1)th time points is estimated in accordance with only the state transition, the probabilities that the value of SOH is included in the range (1), the range (2), and the range (3) at the (t+1)th time point are 0.49 (=0.7×0.7), 0.45 (=0.7×0.3+0.3×(1−0.2)), and 0.06 (=0.3×0.2), respectively. As shown in FIG. 16, the probability that the value of SOH is included in the range (2) at the (t+1)th time point estimated by the method according to the present embodiment is 0.6, which is larger than the probability of 0.45 estimated only due to the state transition and the probability of 0.5 obtained by measuring the characteristic value.

Figure 17:
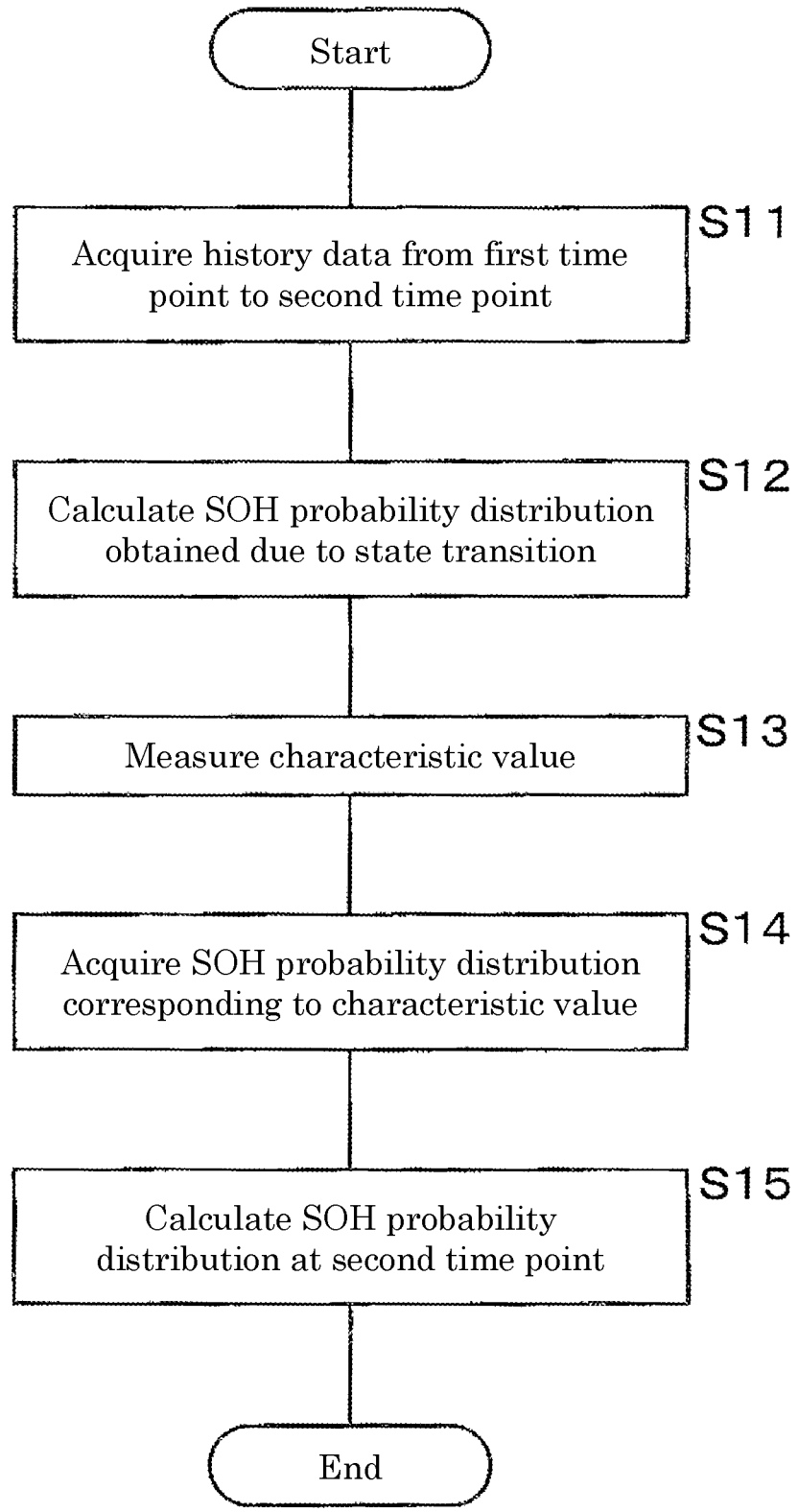
FIG. 17 is a flowchart showing a procedure for processing in which a server apparatus according to a first embodiment estimates the state of the energy storage cell.

Next, the processing of the state estimation apparatus will be described. The server apparatus 2 functions as a state estimation apparatus. As shown in FIG. 2, the energy storage unit 21 of the server apparatus 2 stores history data and state data indicating the state of the energy storage cell 61 estimated at each time point. For example, the state data includes a probability distribution of SOH estimated at each time point. FIG. 17 is a flowchart showing a procedure for processing in which the server apparatus 2 according to the first embodiment estimates the state of the energy storage cell 61. The control unit 20 of the server apparatus 2 executes the following processing in accordance with the computer program 2P.

The state data includes data representing the state of the energy storage cell 61 estimated at the first time point. The server apparatus 2 acquires history data of the energy storage cell 61 from the first time point to the second time point (S11). The control board 7 acquires the voltage, current, and temperature of the energy storage cell 61 as needed and transmits information indicating the acquired voltage, current, and temperature. The information indicating the voltage, current, and temperature is transmitted to the server apparatus 2 via the battery management apparatus 5, the management apparatus M, the communication apparatus 1, and the communication network N. The server apparatus 2 receives information indicating the voltage, current, and temperature of the energy storage cell 61 in the communication unit 22, and the control unit 20 stores the received information in a storage unit 21. The processing is continued from the first time point to the second time point, and history data including the histories of the voltage, current, and temperature of the energy storage cell 61 is acquired. Alternatively, the history data may be stored into a storage apparatus except for the server apparatus 2.

Next, the control unit 20 calculates a probability distribution of SOH at the second time point obtained in accordance with the state transition (S12). For example, the storage unit 21 stores the state-transition probability in association with the pattern of the history data. The state-transition probability shown in FIG. 15 is an example of the state-transition probability associated with the pattern of the history data representing the operation history of leaving the energy storage cell 61 for one month. The state-transition probability may be set on the basis of experience or experiment or may be set by theoretical calculation. The control unit 20 reads the state-transition probability corresponding to the pattern of the history data obtained from the first time point to the second time point from the storage unit 21. The control unit 20 also reads the probability distribution of SOH at the first time point from the storage unit 21. The probability distribution of SOH at the first time point is included in the state data. The control unit 20 calculates the probability distribution of SOH at the second time point obtained in accordance with the state transition from the state-transition probability and the probability distribution of SOH at the first time point. The probability that the SOH becomes a certain value is obtained by multiplying the probability that the SOH is at that value at the first time point by the probability that the SOH does not transition from that value, multiplying the probability that the SOH is at another value at the first time point by the probability that the SOH transitions from another value to that value, and adding the multiplication values.

The processing of S12 may be performed using a learning model. The processing of S12 corresponds to the first acquisition unit. The probability distribution of SOH calculated by the processing of S12 corresponds to the first probability distribution.

Next, the control unit 20 measures the characteristic value of the energy storage cell 61 at the second time point (S13). For example, the control unit 20 causes the communication unit 22 to transmit a control signal for measuring the characteristic value to the control board 7 of the energy storage module 6 that includes the target energy storage cell 61. The control signal is transmitted to the control board 7 via the communication network N, the communication device 1, the management apparatus M, and the battery management apparatus 5. The control board 7 acquires behavior data including voltage, current, temperature, and the like of the energy storage cell 61 in accordance with the control signal for a predetermined period necessary for measuring the characteristic value and under specific conditions, and transmits the acquired behavior data to the server apparatus 2. The server apparatus 2 receives the behavior data in the communication unit 22 and causes the control unit 20 to store the received behavior data into the storage unit 21. The control unit 20 calculates the characteristic value of the energy storage cell 61 on the basis of the behavior data. For example, the characteristic value is DCR inside the energy storage cell 61. The processing of S12 and S13 may be performed in the reverse order.

Next, the control unit 20 acquires the probability distribution of SOH corresponding to the measured characteristic value (S14). For example, as shown in FIG. 9, the energy storage unit 21 stores data indicating the relationship between the characteristic value of the energy storage cell 61 and the probability distribution of SOH. The control unit 20 reads the probability distribution of SOH corresponding to the measured characteristic value from the storage unit 21 to acquire the probability distribution of SOH corresponding to the characteristic value. The processing of S14 may be performed using a learning model. The processing of S14 corresponds to the second acquisition unit. The probability distribution of SOH calculated by the processing of S14 corresponds to the second probability distribution.

Next, the control unit 20 calculates the probability distribution of SOH at the second time point (S15). In S15, the control unit 20 multiples the probability obtained in S12 by the probability obtained in S14 for each value of SOH and normalizes the multiplication value, thereby calculating the probability distribution of SOH at the second time point. The obtained probability distribution represents the state of the energy storage cell 61 at the second time point and is an estimation result of the state of the energy storage cell 61 at the second time point. The processing in S15 corresponds to the estimation unit. Thus, the processing of estimating the state of the energy storage cell 61 is completed.

The server apparatus 2 repeats the processing of S11 to S15. By repeating the processing of S11 to S15, the state of the energy storage cell 61 is estimated sequentially. The server apparatus 2 repeats the processing of S11 to S15 for each of the plurality of energy storage cells 61 The states of the plurality of energy storage cells 61 are estimated sequentially.

The server apparatus 2 can also set the second time point as a future time point and predict the state of the energy storage cell 61 in the future. In this case, the server apparatus 2 does not perform the processing of S11 and calculates a state-transition probability in accordance with a virtual event (assumed pattern) indicating how the energy storage cell 61 operates up to the second time point in the future. The assumed pattern is, for example, an assumed charge-discharge pattern or an assumed temperature pattern. In S12, the server apparatus 2 calculates a probability distribution of SOH on the basis of the state of the energy storage cell 61 at the current time point and the state-transition probability. The obtained probability distribution represents the state of the energy storage cell 61 that is predicted when the energy storage cell 61 is used in accordance with the assumed pattern. It is possible to predict (simulate) the state of the energy storage cell 61 in the future. Such a state prediction simulator (life prediction simulator) is not limited to the server apparatus 2 in the remote monitoring system 100. A standalone simulator may perform the function described above.

As described above in detail, in the present embodiment, the state of the energy storage cell 61 is expressed in the form of the probability distribution indicating the probability that the value of SOH becomes each value between 0 and 1. There is uncertainty in the estimated SOH, and the uncertainty varies depending on the estimation method. By using the probability distribution, it is possible to express the value of SOH and the uncertainty according to the estimation method. In the present embodiment, a probability distribution (first probability distribution) of SOH at the second time point obtained in accordance with the state transition is obtained using the state of the energy storage cell 61 at the first time point ((t−1)th time point) and the state-transition probability corresponding to the operation history of the energy storage cell 61 from the first time point to the second time point (t-th time point). The change in SOH of the energy storage cell 61 varies in accordance with an operation history such as repeating the charge and discharge or leaving the energy storage battery. By using the state-transition probability corresponding to the operation history, it is possible to estimate SOH of the energy storage cell 61 which changes from the first time point to the second time point in accordance with the operation history. SOH of the energy storage cell 61 can be estimated in real time while the operation of the energy storage cell 61 is continued.

In the present embodiment, the characteristic value of the energy storage cell 61 such as DCR at the second time point is measured, and the probability distribution of the SOH at the second time point (second probability distribution) is acquired on the basis of the characteristic value. By acquiring SOH on the basis of the characteristic value obtained by the measurement for a short time, SOH can be estimated with the influence of an estimation error reduced, the error occurring at the time of sequentially estimating SOH corresponding to the operation history.

In the present embodiment, by integrating the first probability distribution and the second probability distribution, the state of the energy storage cell 61 at the second time point is estimated in the form of the probability distribution of SOH. By integrating the probability distributions of SOH obtained by the two methods, the state of the energy storage cell 61 can be analyzed in a multi-faceted manner. Further, probable SOH can be estimated with high robustness compared to a case where SOH is definitely estimated by an individual method. By integrating the probability distribution of SOH obtained in accordance with the state transition and the probability distribution of SOH obtained by measuring the characteristic value, it is possible to reduce the influence of an estimation error that occurs at the time of estimating SOH corresponding to the operation history. It is possible to estimate SOH of the energy storage cell 61 in real time while reducing the influence of an estimation error. Even when an error is included in the measurement of the characteristic value, by using the probability distribution of SOH obtained in accordance with the state transition, it is possible to estimate more probable SOH that reduces the influence of the measurement error.

By using the probability distribution of SOH obtained by measuring the characteristic value, it is possible to reset the accumulation of estimation errors that occur at the time of estimating SOH corresponding to the operation history. For example, the remote monitoring system 100 may erase the history data after estimating the state of the energy storage cell 61 at the second time point. This makes it possible to reduce the storage capacity and the communication capacity and to more effectively use the hardware resources and network resources of the remote monitoring system 100.

Second Embodiment

Figure 18:
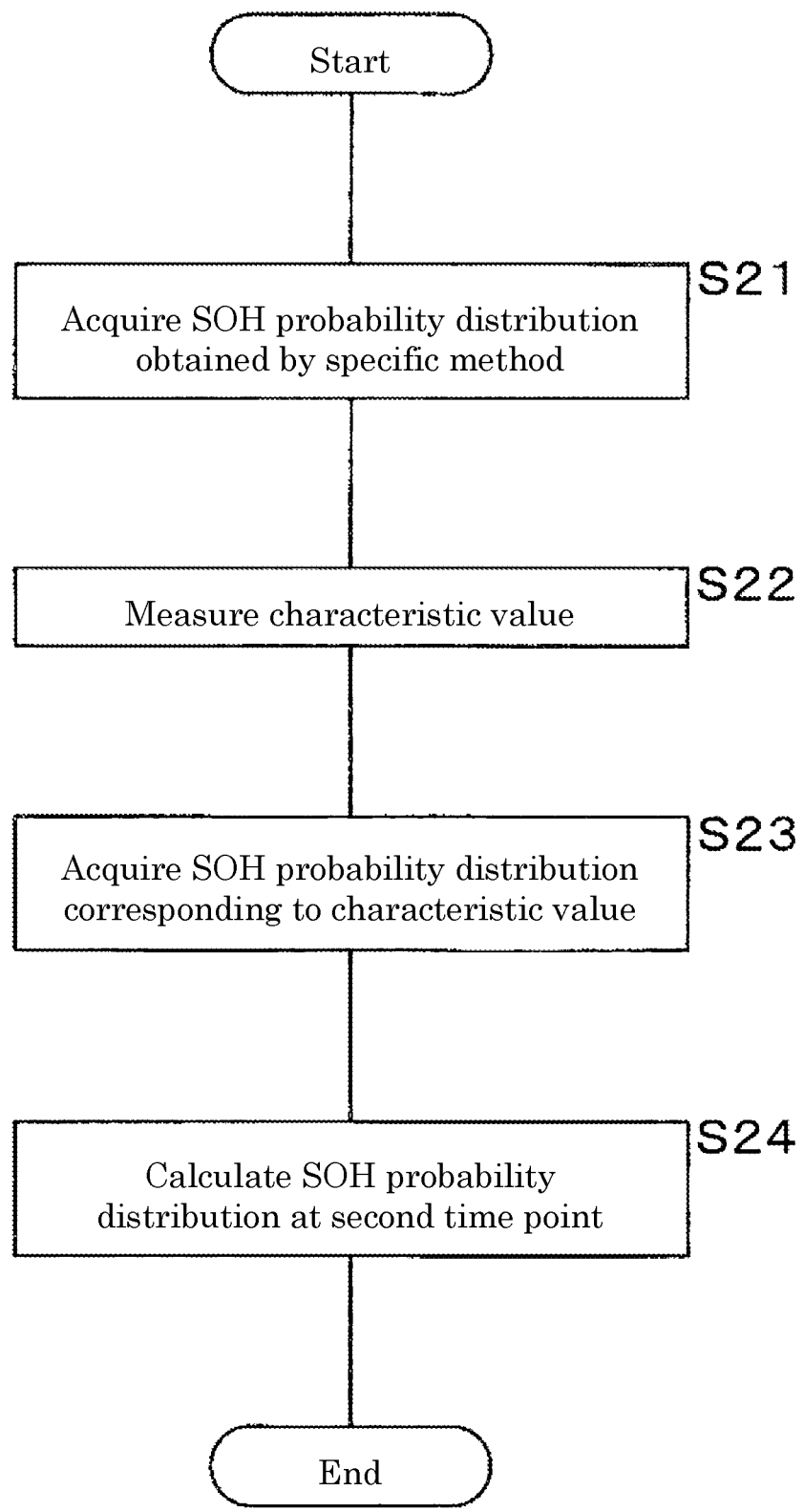
FIG. 18 is a flowchart showing a procedure for processing in which a server apparatus according to a second embodiment estimates the state of the energy storage cell.

In a second embodiment, a mode in which the state-transition probability is not used is shown. The configurations of the energy storage system 101 and the remote monitoring system 100 are the same as those of the first embodiment. FIG. 18 is a flowchart showing a procedure for the processing of the server apparatus 2 estimating the state of the energy storage cell 61 according to the second embodiment. The control unit 20 of the server apparatus 2 executes the following processing in accordance with the computer program 2P.

The control unit 20 acquires the probability distribution of SOH obtained by a specific method (S21). In S21, the probability distribution of SOH is acquired by a method different from the method using the state-transition probability. For example, when the history data of the energy storage cell 61 for one month is lost, the probability that SOH becomes each value is assumed to be identical for all the values of SOH. Next, the control unit 20 measures the characteristic value of the energy storage cell 61 at the second time point (S22) and acquires the probability distribution of SOH corresponding to the measured characteristic value (S23).

Next, the control unit 20 calculates the probability distribution of SOH at the second time point (S24). In S24, the control unit 20 multiples the probability obtained in S21 by the probability obtained in S23 for each value of SOH and normalizes the multiplication value, thereby calculating the probability distribution of SOH at the second time point. The obtained probability distribution represents the state of the energy storage cell 61 at the second time point and is an estimation result of the state of the energy storage cell 61 at the second time point. Thus, the processing of estimating the state of the energy storage cell 61 is completed.

In the present embodiment, by using the first probability distribution of SOH obtained by the first method and the second probability distribution of SOH obtained by the second method, the state of the energy storage cell 61 is estimated in the form of the probability distribution of SOH. By integrating the probability distributions of SOH obtained by the two methods, the state of the energy storage cell 61 can be analyzed in various ways, and more probable SOH can be obtained. Probable SOH can be estimated with high robustness from the probability distribution of SOH obtained by the two methods without considering the state transition. For example, also for the energy storage cell 61 the history data of which is lost, probable SOH can be estimated by acquiring the probability distribution of SOH by the two methods.

Third Embodiment

Figure 19:
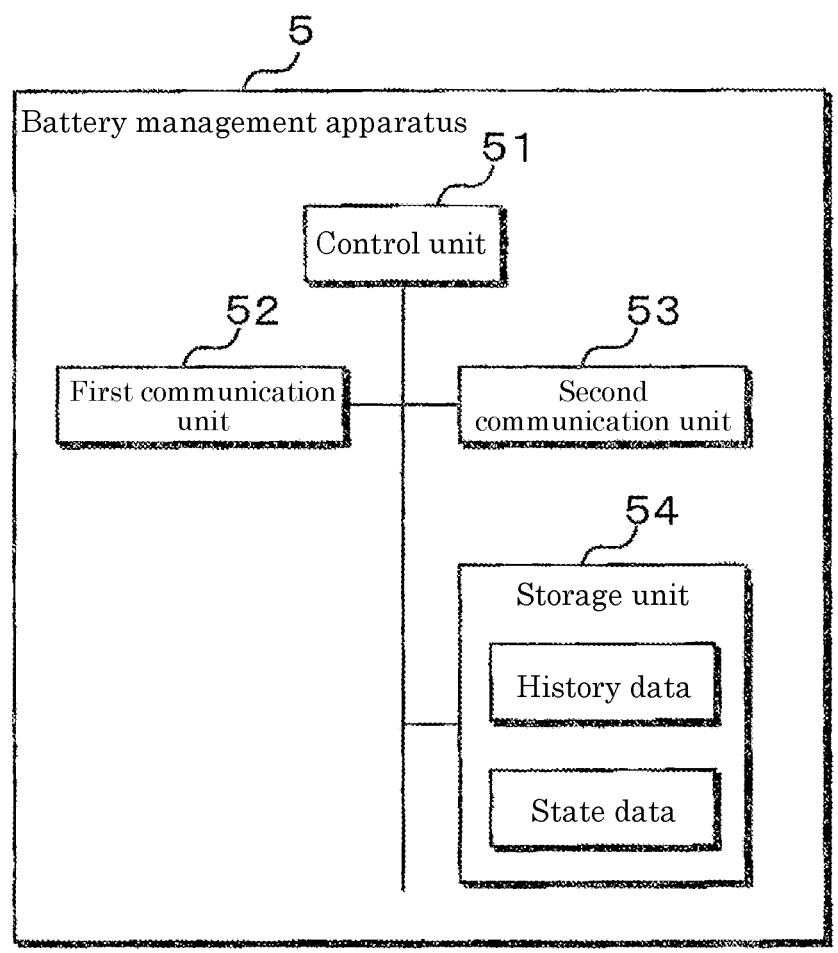
FIG. 19 is a block diagram showing a functional configuration example of a battery management apparatus functioning as a state estimation apparatus.

In a third embodiment, the battery management apparatus 5 or the management apparatus M functions as the state estimation apparatus. FIG. 19 is a block diagram showing a functional configuration example of the battery management apparatus 5 functioning as the state estimation apparatus. The battery management apparatus 5 further includes a storage unit 54. The storage unit 54 is a hard disk or a nonvolatile memory. The storage unit 54 stores history data and state data.

Figure 20:
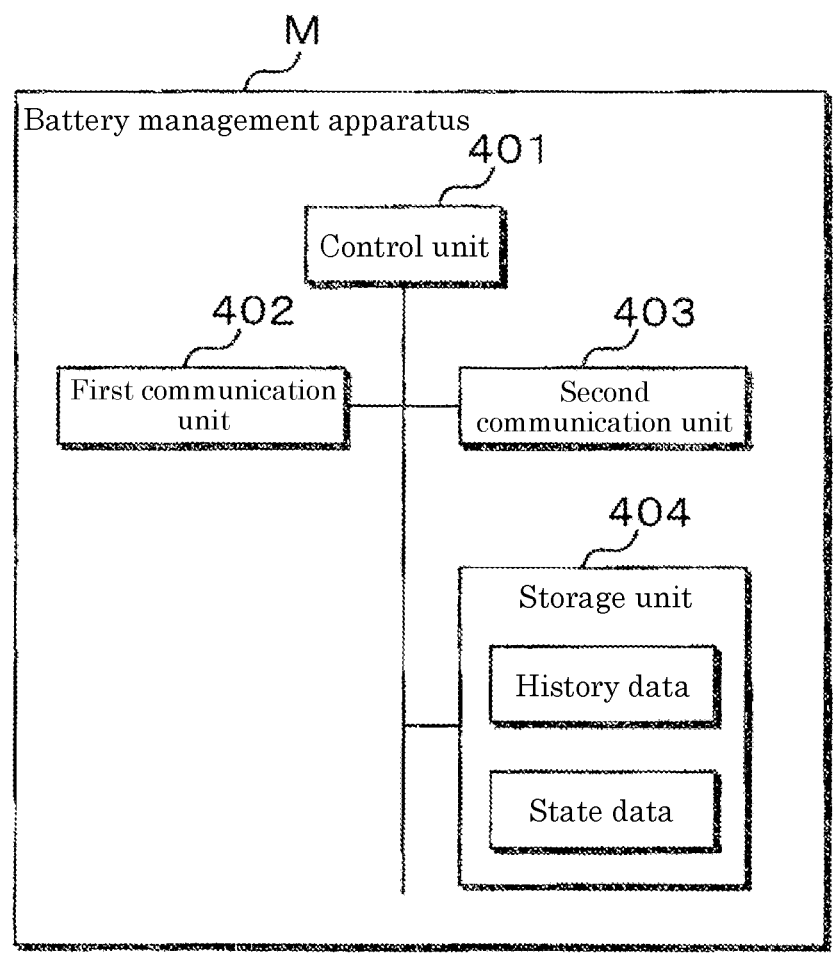
FIG. 20 is a block diagram showing a functional configuration example of a management apparatus functioning as the state estimation apparatus.

FIG. 20 is a block diagram showing a functional configuration example of the management apparatus M functioning as the state estimation apparatus. The management apparatus M further includes a storage unit 404. The storage unit 404 is a hard disk or a nonvolatile memory. The storage unit 404 stores history data and state data. The other configurations of the energy storage system 101 and the remote monitoring system 100 are the same as those of the first embodiment.

As in the first or second embodiment, the battery management apparatus 5 or the management apparatus M as the state estimation apparatus executes the processing of estimating the state of the energy storage cell 61 as shown in the flowchart of FIG. 17 or FIG. 18. Also, in the present embodiment, as in the first and second embodiments, it is possible to estimate probable SOH with high robustness for the energy storage cell 61.

In the first to third embodiments, the energy storage device as a target for estimating the state is the energy storage cell 61. Alternatively, the remote monitoring system 100 may use the energy storage module 6 as the energy storage device. The remote monitoring system 100 may use the bank 4 as the energy storage device.

The energy storage device as the target for estimating the state may be an energy storage cell or an energy storage module mounted on a vehicle. A control unit such as an engine control unit (ECU) mounted on the vehicle may function as a state estimation apparatus, or alternatively, the state estimation may be realized on a cloud base. The vehicle may include an energy storage device, a state estimation apparatus for estimating the state of the energy storage device, and a display unit for displaying the estimation result. Alternatively, the vehicle may include an energy storage device, a communication device for transmitting information including the state of the energy storage device to the outside of the vehicle and receiving the estimation result, and a display unit for displaying the estimation result.

The presently disclosed embodiments are illustrative in all respects and should not be considered as limiting. The scope of the present invention is shown by the claims rather than the meanings described above and is intended to include meanings equivalent to the claims and all modifications within the claims.

DESCRIPTION OF REFERENCE SIGNS

100: remote monitoring system
101: energy storage system
2: server apparatus
20: control unit
21: storage unit
4: bank
5: battery management apparatus
6: energy storage module
61: energy storage cell
7: control board
M: management apparatus

The invention claimed is:

1. A state estimation method for estimating a state of an energy storage device, the method comprising:
   acquiring, by a first method, a first probability distribution that expresses the state of the energy storage device in a form of a probability distribution;
   acquiring, by a second method different from the first method, a second probability distribution that expresses the state of the energy storage device in a form of a probability distribution;
   calculating an estimate of the state of the energy storage device by integrally combining the first probability distribution with the second probability distribution to obtain an integrated probability; and
   upon calculating the estimate of the state of the energy storage device and during continued operation of the energy storage device, resetting an accumulation of estimation errors associated with the energy storage device.

2. The state estimation method according to claim 1, wherein in the first method, a state of the energy storage device at a t-th time point is influenced by a state of the energy storage device at a (t−1)th time point, and in the second method, the state of the energy storage device at the t-th time point is not influenced by the state of the energy storage device at the (t−1)th time point.

3. The state estimation method according to claim 1, wherein a history traced by the energy storage device from a first time point to a second time point is acquired, and
   in the first method, the first probability distribution at the second time point is calculated on a basis of the history.

4. The state estimation method according to claim 1, wherein a characteristic value indicating a characteristic of the energy storage device at a specific time point is measured, and
   in the second method, the second probability distribution at the specific time point is acquired on a basis of the characteristic value.

5. The state estimation method according to claim 1, wherein in accordance with a model of a partially observable Markov decision process, the first probability distribution at the second time point is calculated using the state of the energy storage device at the first time point and a state-transition probability corresponding to a history of the energy storage device from the first time point to the second time point,
   the second probability distribution is acquired on a basis of a characteristic value indicating a characteristic of the energy storage device at the second time point, and the state of the energy storage device at the second time point is estimated from the first probability distribution and the second probability distribution.

6. The state estimation method according to claim 1, wherein the integrally combining involves multiplying the first probability distribution by the second probability distribution to obtain an integrated probability.

7. A state estimation apparatus for estimating a state of an energy storage device, the apparatus comprising:
   a first acquisition unit that acquires, by a first method, a first probability distribution expressing the state of the energy storage device in a form of a probability distribution;
   a second acquisition unit that acquires, by a second method different from the first method, a second probability distribution expressing the state of the energy storage device in a form of a probability distribution;
   an estimation unit that calculates estimates the state of the energy storage device by integrally combining the first probability distribution with the second probability distribution to obtain an integrated probability; and
   a control unit in communication with a storage unit, the control unit, upon calculation of the estimate of the state of the energy storage device by the estimation unit and during continued operation of the energy storage device, resets an accumulation of estimation errors associated with the energy storage device.

8. The state estimation apparatus according to claim 7, wherein in the first method, a state of the energy storage device at a t-th time point is influenced by a state of the energy storage device at a (t−1)th time point, and in the second method, the state of the energy storage device at the t-th time point is not influenced by the state of the energy storage device at the (t−1)th time point.

9. The state estimation apparatus according to claim 7, wherein the first acquisition unit calculates the first probability distribution on a basis of a history traced by the energy storage device.

10. The state estimation method according to claim 7, wherein the second acquisition unit acquires the second probability distribution at the specific time point on a basis of a characteristic value indicating a characteristic of the energy storage device at a specific time point.

11. The state estimation apparatus according to claim 7, wherein the first acquisition unit calculates the first probability distribution at the second time point by using the state of the energy storage device at the first time point and a state-transition probability corresponding to a history of the energy storage device from the first time point to the second time point,
   the second acquisition unit acquires the second probability distribution at the second time point on a basis of a characteristic value indicating a characteristic of the energy storage device at the second time point, and
   the estimation unit estimates the state of the energy storage device at the second time point from the first probability distribution and the second probability distribution in accordance with a model of a partially observable Markov decision process.

* * * * *